United States Patent
Sugawa et al.

(10) Patent No.: US 11,567,114 B2
(45) Date of Patent: Jan. 31, 2023

(54) CAPACITANCE DETECTION AREA SENSOR AND CONDUCTIVE PATTERN SENSING APPARATUS HAVING CAPACITANCE DETECTION AREA SENSOR

(71) Applicants: TOHOKU UNIVERSITY, Sendai (JP); OHT Inc., Fukuyama (JP)

(72) Inventors: Shigetoshi Sugawa, Sendai (JP); Rihito Kuroda, Sendai (JP); Tetsuya Goto, Sendai (JP); Hiroshi Hamori, Fukuyama (JP); Shinichi Murakami, Fukuyama (JP); Toshiro Yasuda, Fukuyama (JP)

(73) Assignees: TOHOKU UNIVERSITY, Miyagi (JP); OHT, INC., Hiroshima (JP)

( * ) Notice: Subject to any disclaimer, the term of this patent is extended or adjusted under 35 U.S.C. 154(b) by 0 days.

(21) Appl. No.: 17/203,928

(22) Filed: Mar. 17, 2021

(65) Prior Publication Data
US 2021/0293866 A1    Sep. 23, 2021

Related U.S. Application Data

(63) Continuation of application No. PCT/JP2019/031387, filed on Aug. 8, 2019.

(30) Foreign Application Priority Data

Sep. 18, 2018 (WO) .................. PCT/JP2018/034435

(51) Int. Cl.
- *G01R 27/26* (2006.01)
- *G01D 5/241* (2006.01)
- *H03K 17/955* (2006.01)

(52) U.S. Cl.
CPC ....... *G01R 27/2605* (2013.01); *G01D 5/2417* (2013.01); *H03K 17/955* (2013.01)

(58) Field of Classification Search
CPC ........ G01R 27/00; G01R 27/02; G01R 27/26; G01R 27/2605; G01R 19/00;
(Continued)

(56) References Cited

U.S. PATENT DOCUMENTS

| 7,173,445 B2 | 2/2007 | Fujii et al. |
| 10,817,114 B2 * | 10/2020 | Sasai ............... H03K 17/955 |

(Continued)

FOREIGN PATENT DOCUMENTS

| JP | 2000-165754 A | 6/2000 |
| JP | 2003-134396 A | 5/2003 |

(Continued)

OTHER PUBLICATIONS

International Preliminary Report on Patentability dated Apr. 5, 2021 received in PCT/JP2019/031387.
(Continued)

*Primary Examiner* — Hoai-An D. Nguyen
(74) *Attorney, Agent, or Firm* — Scully, Scott, Murphy & Presser, P.C.

(57) ABSTRACT

A capacitance detection area sensor includes capacitance sensor elements arranged in a two-dimensional array, is shaped into an appropriate shape, and capacitively coupled to an external electrode. To the external electrode, a sensing signal having a potential difference is supplied. The first and second sensor output signals are acquired from a capacitance sensor element capacitively coupled to the external electrode, at the timing of the sensing signal being a first signal and being a second signal, respectively. A differential signal is generated from a difference between the acquired first and second sensor output signals, and an image indicating the shape of the external electrode is generated based on the level of the differential signal, in different colors or different tones.

6 Claims, 18 Drawing Sheets

(58) Field of Classification Search
CPC ............ G01R 19/0084; G01R 19/0092; G01R 19/145; G01R 19/15; G01R 19/155; G01R 19/165; G01R 29/00; G01R 29/24; G01R 31/00; G01R 31/28; G01R 31/2801; G01R 31/281; G01R 31/2812; G01R 31/2851; G01R 31/2855; G01R 31/2872; G01R 31/2879; G01R 31/302; G01R 31/312; G01R 31/50; G01R 31/52; G01D 5/00; G01D 5/12; G01D 5/14; G01D 5/24; G01D 5/241; G01D 5/2417; G01B 7/00; G01N 27/00; G01N 27/02; G01N 27/22; H03K 17/00; H03K 17/94; H03K 17/945; H03K 17/955; H05K 3/00
See application file for complete search history.

(56) References Cited

U.S. PATENT DOCUMENTS

| | | | |
|---|---|---|---|
| 2004/0241887 | A1 | 12/2004 | Fujii et al. |
| 2018/0367138 | A1* | 12/2018 | Bennett .................... G01D 5/24 |
| 2019/0154616 | A1* | 5/2019 | Wakabayashi ....... H03K 17/955 |
| 2020/0225797 | A1* | 7/2020 | Fujiyoshi ............ G06F 3/04182 |

FOREIGN PATENT DOCUMENTS

| | | |
|---|---|---|
| JP | 2003-207547 A | 7/2003 |
| JP | 2006-153631 A | 6/2006 |
| JP | 4623887 B2 | 2/2011 |
| JP | 2014-190743 A | 10/2014 |
| JP | 2019-095224 A | 6/2019 |

OTHER PUBLICATIONS

International Preliminary Report on Patentability dated Apr. 5, 2021 received in PCT/JP2018/034435.
Japanese Office Action dated Nov. 30, 2021 received in 2020-548123.
International Search Report dated Sep. 3, 2019 issued in PCT/JP2019/031387.
English Abstract of JP 2003-066086 A, dated Mar. 5, 2002.
Korean Office Action dated Feb. 21, 2022 received in 10-2020-7036555.
Japanese Office Action dated Jun. 14, 2022 received in 2020-548123.

* cited by examiner

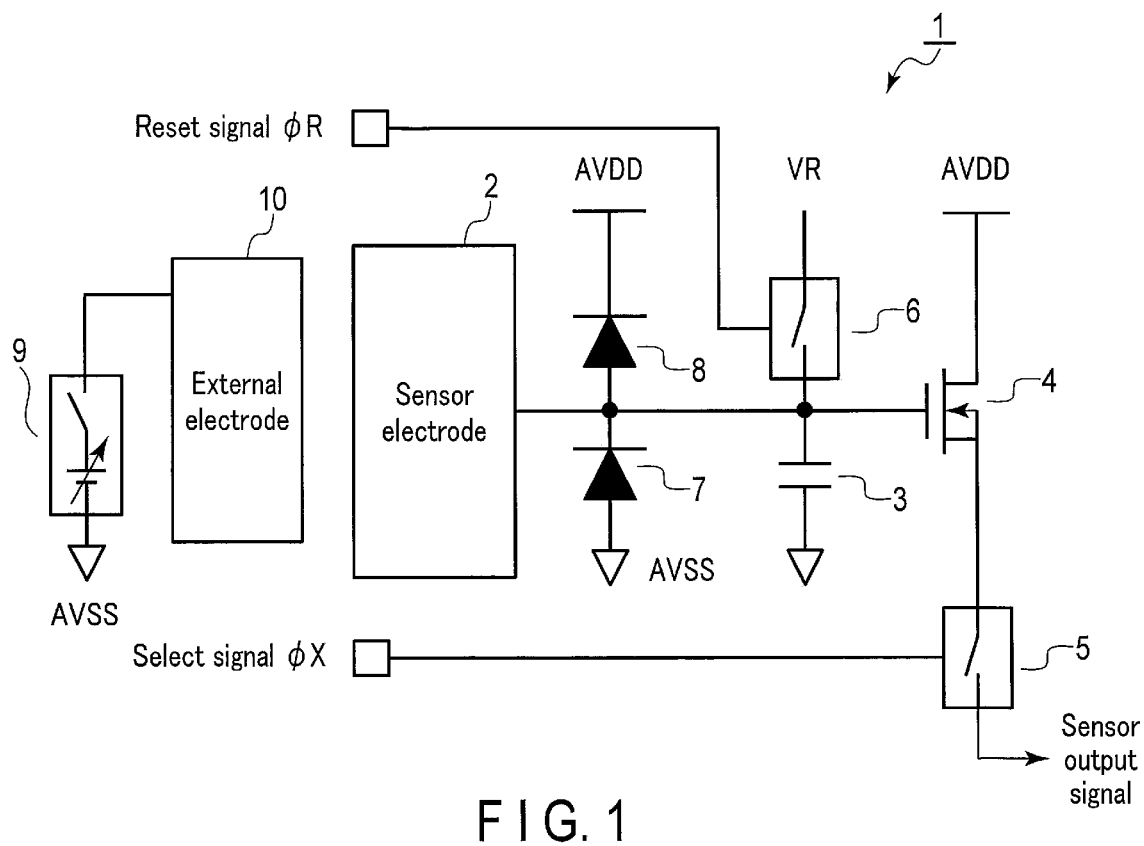
F I G. 1
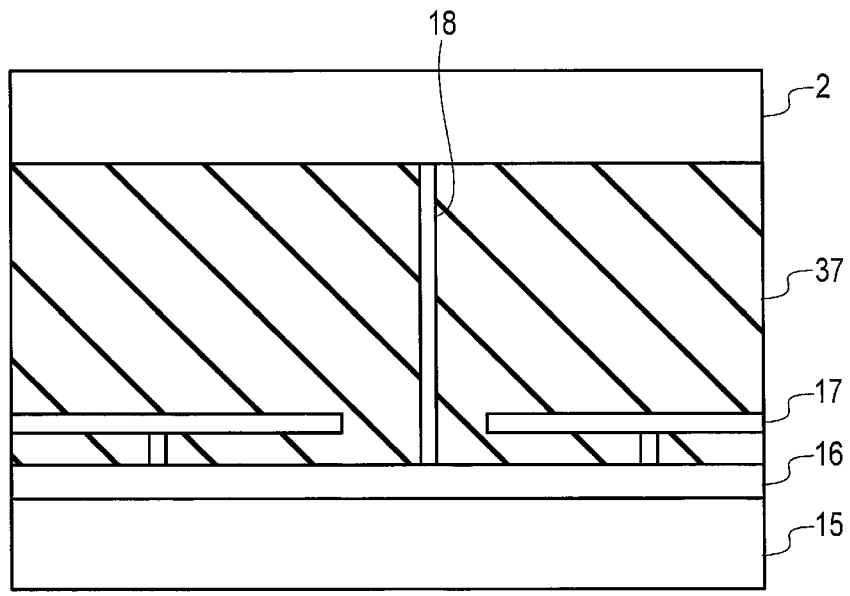
F I G. 2

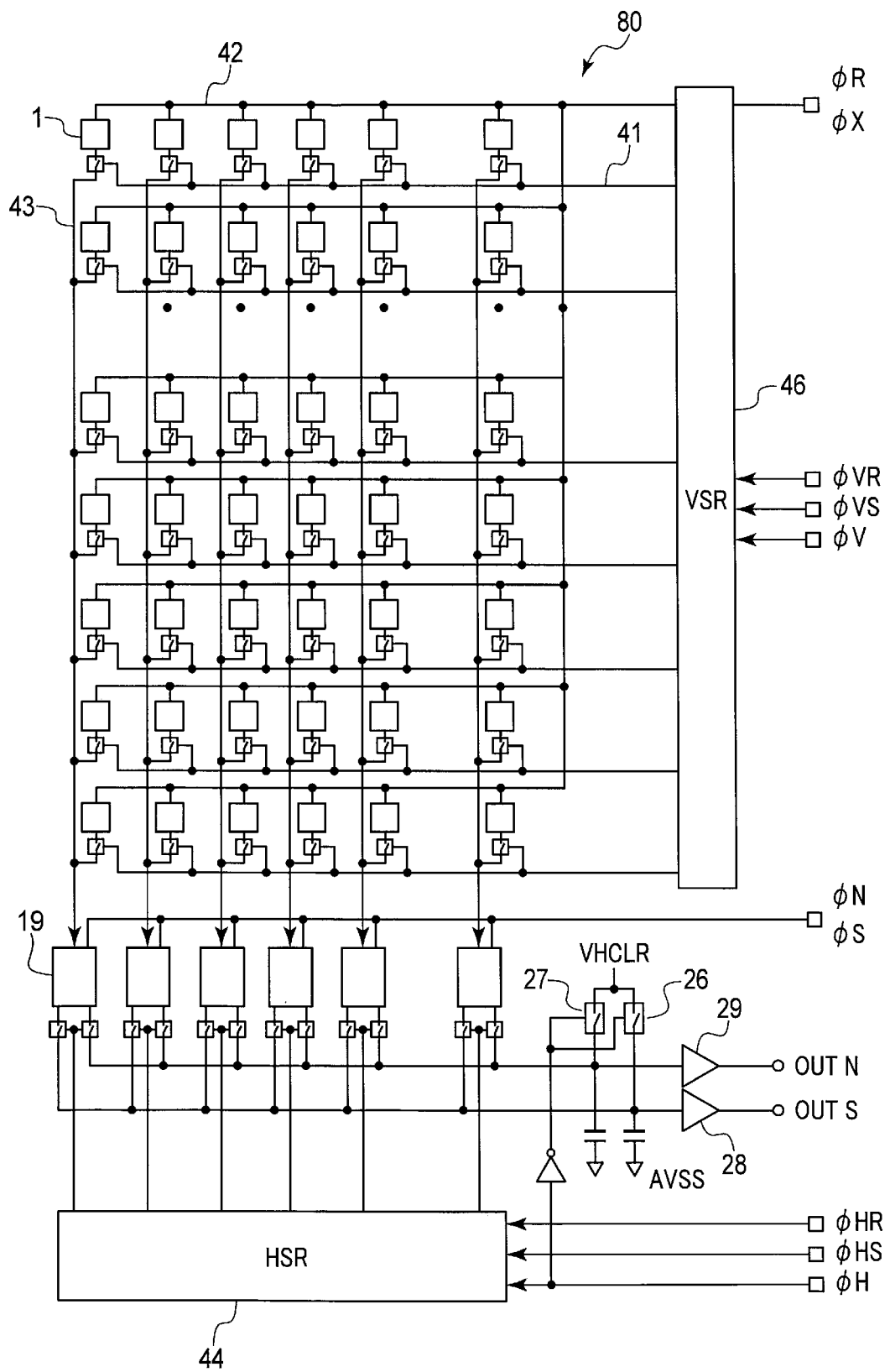
F I G. 6

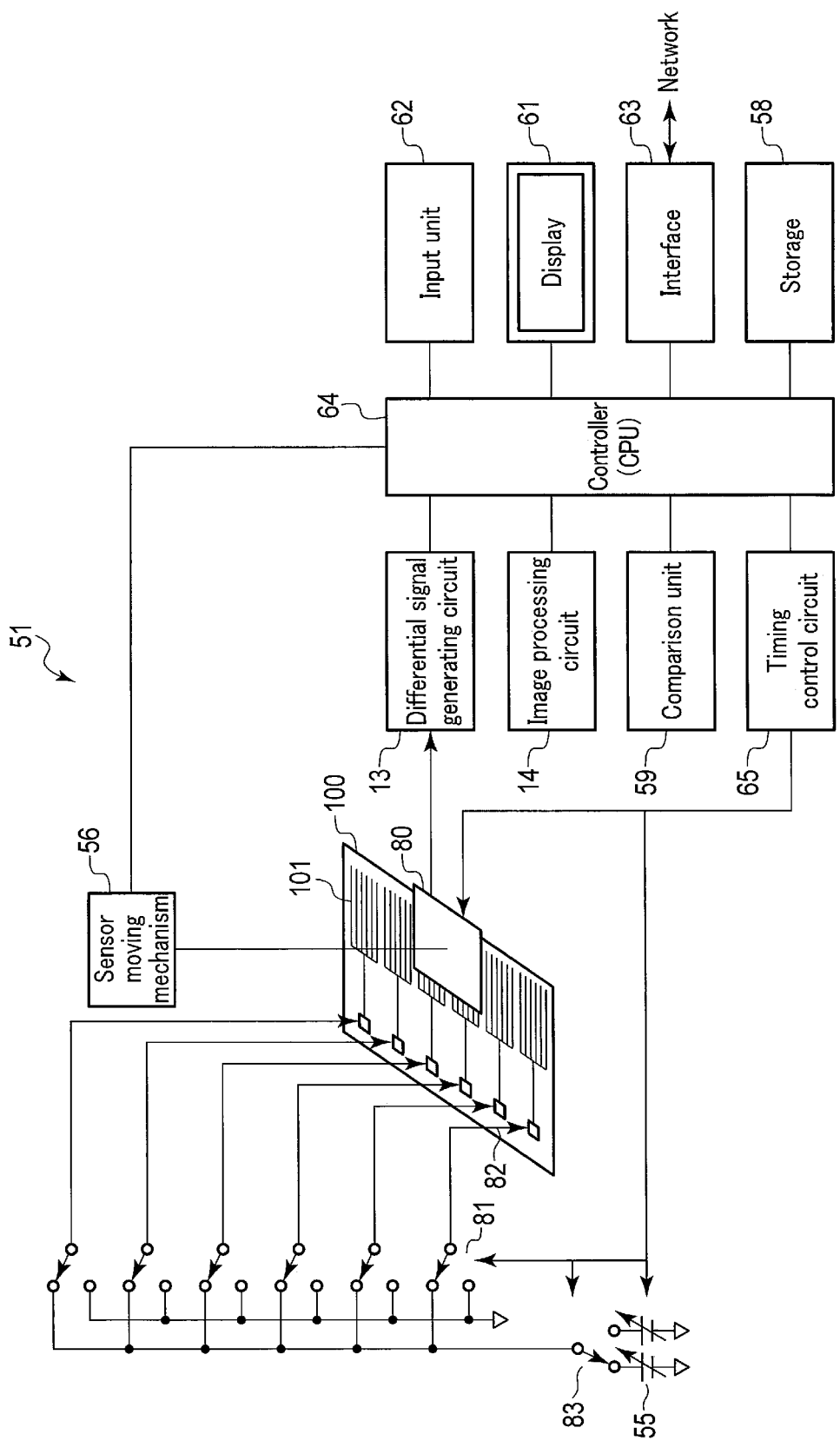
F I G. 10

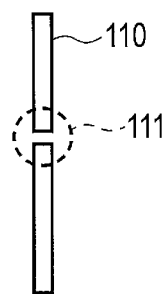
F I G. 12A
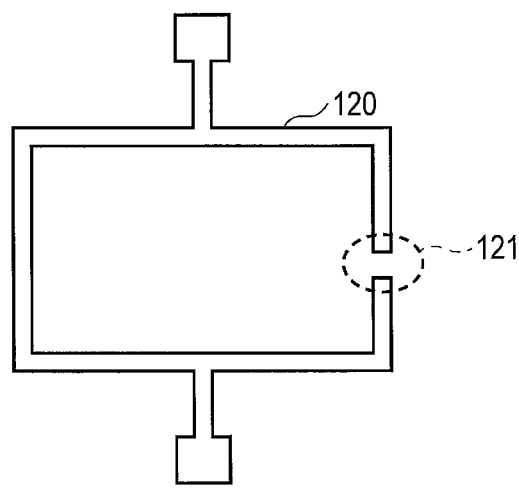
F I G. 12B

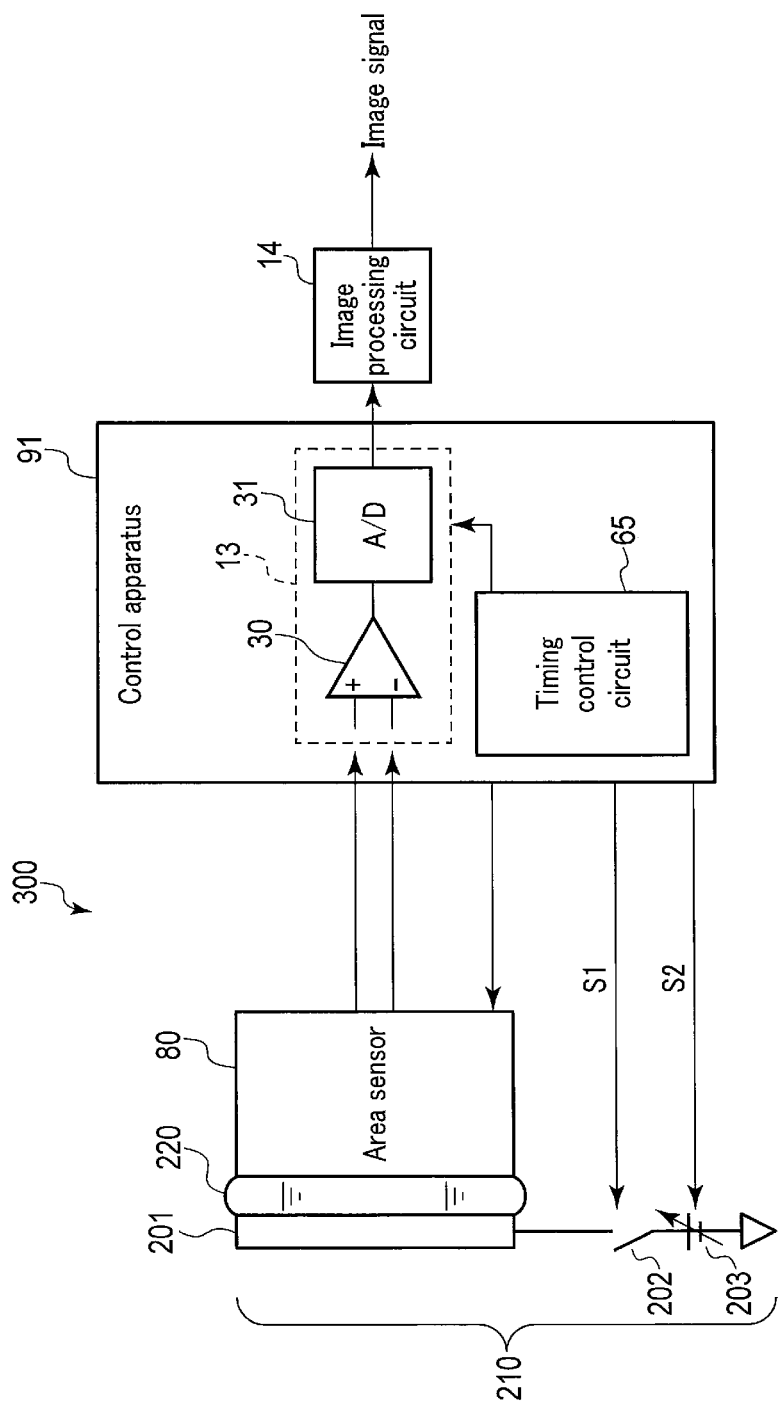
F I G 14

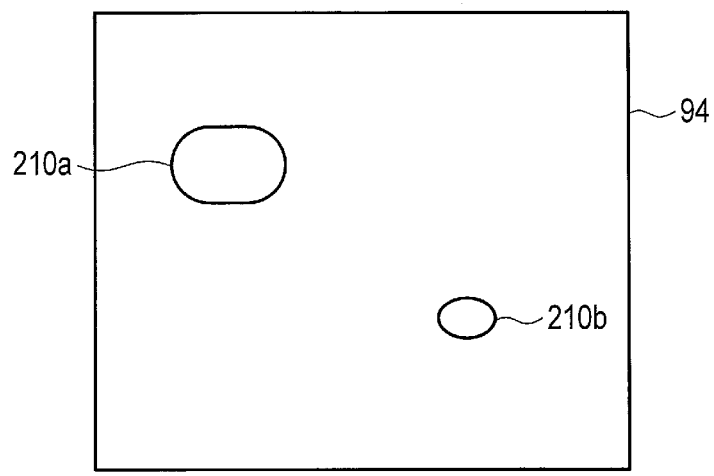
F I G. 16A
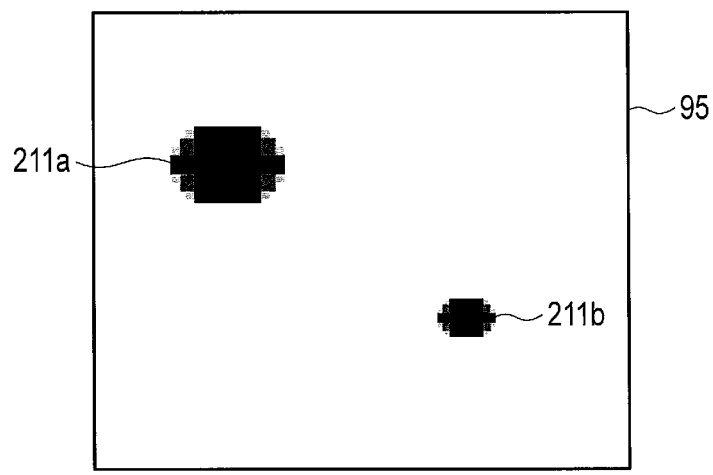
F I G. 16B

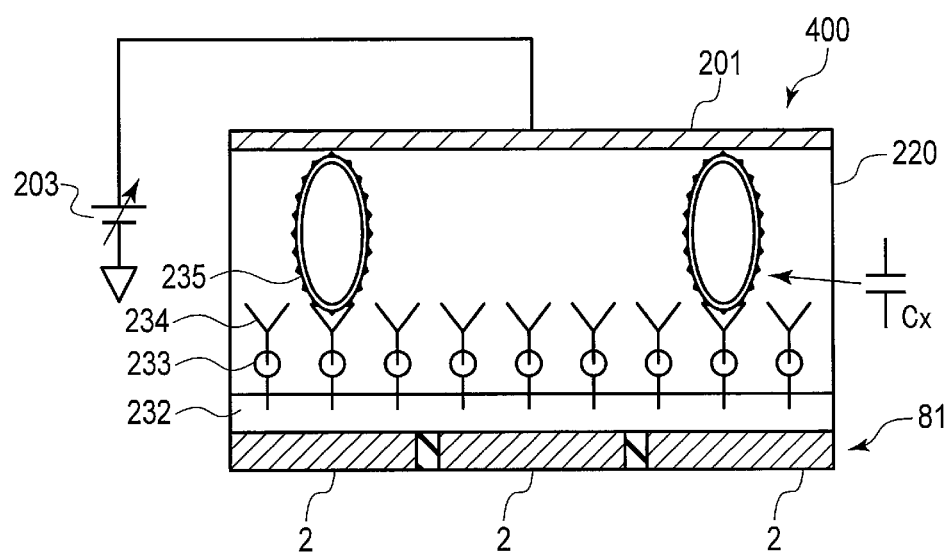
F I G. 17

CAPACITANCE DETECTION AREA SENSOR AND CONDUCTIVE PATTERN SENSING APPARATUS HAVING CAPACITANCE DETECTION AREA SENSOR

CROSS-REFERENCE TO RELATED APPLICATIONS

This application is a Continuation Application of PCT Application No. PCT/JP2019/031387, filed Aug. 8, 2019 and based upon and claiming the benefit of priority from the prior PCT Application No. PCT/JP2018/034435, filed Sep. 18, 2018, the entire contents of both of which are incorporated herein by reference.

FIELD

The disclosure relates to a capacitance detection area sensor and a conductive pattern sensing apparatus having such a capacitance detection area sensor.

BACKGROUND

In conventional detection of defects such as shortings and breaks in lines of a conductive pattern formed on a circuit board, a determination is made based on whether or not a supplied sensing signal is detected. In an ordinary pattern sensing apparatus, the feeding terminal of the a sensor is brought into contact with one end of a conductive pattern so that a certain sensing signal can be input through the feeding terminal, and the other end of this conductive pattern is brought into contact with the detection terminal of the sensor, at which the sensing signal can be detected.

To be taken into consideration is the fact that as recent conductive patterns become finer, contact with the terminals of the sensor may damage the patterns. For instance, a conductive pattern sensing apparatus has been suggested in which a capacitively coupled non-contact sensor is incorporated, as described in Japanese Patent No. 4623887. In the case of detection with such a non-contact sensor, a sensor electrode is placed close to a line of a conductive pattern to use this line as a counter electrode facing the sensor electrode. With the sensor electrode capacitively coupled to this counter electrode, the potential of the sensor electrode, which changes through the capacitive coupling as the voltage level of the counter electrode is changed from the ground level to a certain voltage level, is measured to achieve the detection.

For a circuit board in which a defect is detected, laser repair and film forming onto a defective portion are attempted in order to increase product yield of production and reduce production costs. For such repair work, however, the position of the defective portion of a line on the conductive pattern needs to be identified.

Generally, conductive patterns may contain not only linear lines but also diverted portions for the mounting of circuit components and bent portions to avoid the crossing of conductive patterns. In addition, portions that branch in the middle and conductive patterns needing to be ended halfway to form a contact with a lead terminal of a mounted component may also be included. If the conductive pattern is in a loop form, a defective portion may not be detected at all.

Furthermore, through a detection based on two sensing positions, the presence/absence of a defect may be detected, but the position of a detective portion present somewhere in the middle of a pattern cannot be identified. For this reason, on the circuit detection apparatus that carries an optical observation device or imaging device, a conductive pattern determined to include a defect may be enlarged on the display so that the conductive pattern may be traced and an operator may visually identify the defective portion. As the time required for the defective portion detection greatly depends on human factors such as the ability and experience of each operator, it is difficult to enhance working efficiency with such a detection technique.

The detection apparatus adopting a non-contact sensor described in the Japanese Patent No. 4623887 offers detection with an increased spatial resolution, using two-dimensionally arrayed pixels. When completing a reset operation for resetting the sensor electrode to a predetermined potential, however, thermal noise caused by the ON resistance of the reset transistor tends to be absorbed and remains in the sensor electrode. This thermal noise randomly changes every time the reset operation is completed. It is known that the change of the potential of the sensor electrode caused by the thermal noise is inversely proportional to the square root of the capacitance value parasitic in the sensor electrode. This results in increased thermal noise when attempting to reduce the parasitic capacitance in the sensor electrode in order to enhance the capacitive coupling with the detection electrode, which thus prevents a highly-sensitive capacitance detection from being achieved.

A capacitance detection area sensor having a high sensitivity and high sensing resolution that can offer a high spatial image resolution has yet to be realized. A real-time capacitance detection area sensor having a higher time resolution has also yet to be realized.

The disclosure offers a capacitance detection area sensor in which capacitance sensor elements each having a minute detection area are arranged in a two-dimensional array so that the distribution of detected capacitances can be acquired as image information. The disclosure further offers a conductive pattern sensing apparatus with this capacitance detection area sensor, with which the distribution of the voltages of conductive patterns to which a sensing signal is supplied can be acquired as image information of the conductive patterns, thereby realizing detection of defects such as breaks and short-circuiting in the patterns.

SUMMARY

The capacitance detection area sensor according to an embodiment includes a capacitance detection area sensor circuit including a plurality of capacitance sensor elements arranged in a two-dimensional array, each of the capacitance sensor elements including a sensor electrode configured to, when capacitively coupled with a detection target having an electrical charge, detect an electrical charge in accordance with a change in a capacitance, a storage element configured to store an electrical charge of the sensor electrode, and a reset element configured to reset the storage element; a sensor element selection circuit configured to select a capacitance sensor element to be capacitively coupled sequentially from the capacitance detection area sensor circuit in order of rows or columns; a reading circuit configured to acquire a first signal at a first potential and a second signal at a second potential different from the first potential, from the selected capacitance sensor; a first signal storage circuit arranged for each column to store the read-out first signal; a second signal storage circuit arrange for each column to store the read-out second signal; a differential signal generating circuit configured to calculate a difference between the stored first signal and the stored second signal to generate a differential signal; an image processing circuit configured to generate an image representing a shape of the detection target based on a level of the differential signal from the differential signal generating circuit; and a controller configured to open the reset element of the capacitance detection area sensor circuit after bringing the reset element into conduction for each one of the rows selected from among the two-dimensional array to reset the storage element to set a potential of the sensor electrode to a reference value; acquire the first signal to store the first signal in the first signal storage circuit; after a predetermined period of time, acquire the second signal to store the second signal in the second signal storage circuit; and, after a predetermined period of time, calculate a differential signal of the first signal read from the first signal storage circuit and the second signal read from the second signal storage circuit.

BRIEF DESCRIPTION OF THE DRAWINGS

FIG. 1 is a diagram showing a circuit structure of a capacitance sensor element according to one embodiment.

FIG. 2 is a diagram showing an exemplary cross-sectional structure of the capacitance sensor element.

FIG. 6 is a diagram showing a conceptual circuit structure of a capacitance detection area sensor where the sensor elements are two-dimensionally arrayed.

FIG. 10 is a diagram showing a conceptual structure of a conductive pattern sensing apparatus incorporating the capacitance detection area sensor according to the first embodiment.

FIG. 12A is a diagram showing a linear conductive pattern.

FIG. 12B is a diagram showing a looped conductive pattern.

FIG. 14 is a diagram showing a conceptual structure of a cell-size sensing apparatus incorporating a capacitance detection area sensor according to the second embodiment.

FIG. 16A is a conceptual diagram showing cells present on the area sensor.

FIG. 16B is a conceptual diagram showing a cell image displayed on a display screen by rendering the image of FIG. 16A.

FIG. 17 is a conceptual diagram explaining an antigen capturing operation of an antigen capturing and detecting apparatus according to the third embodiment.

DETAILED DESCRIPTION

Figure 3:
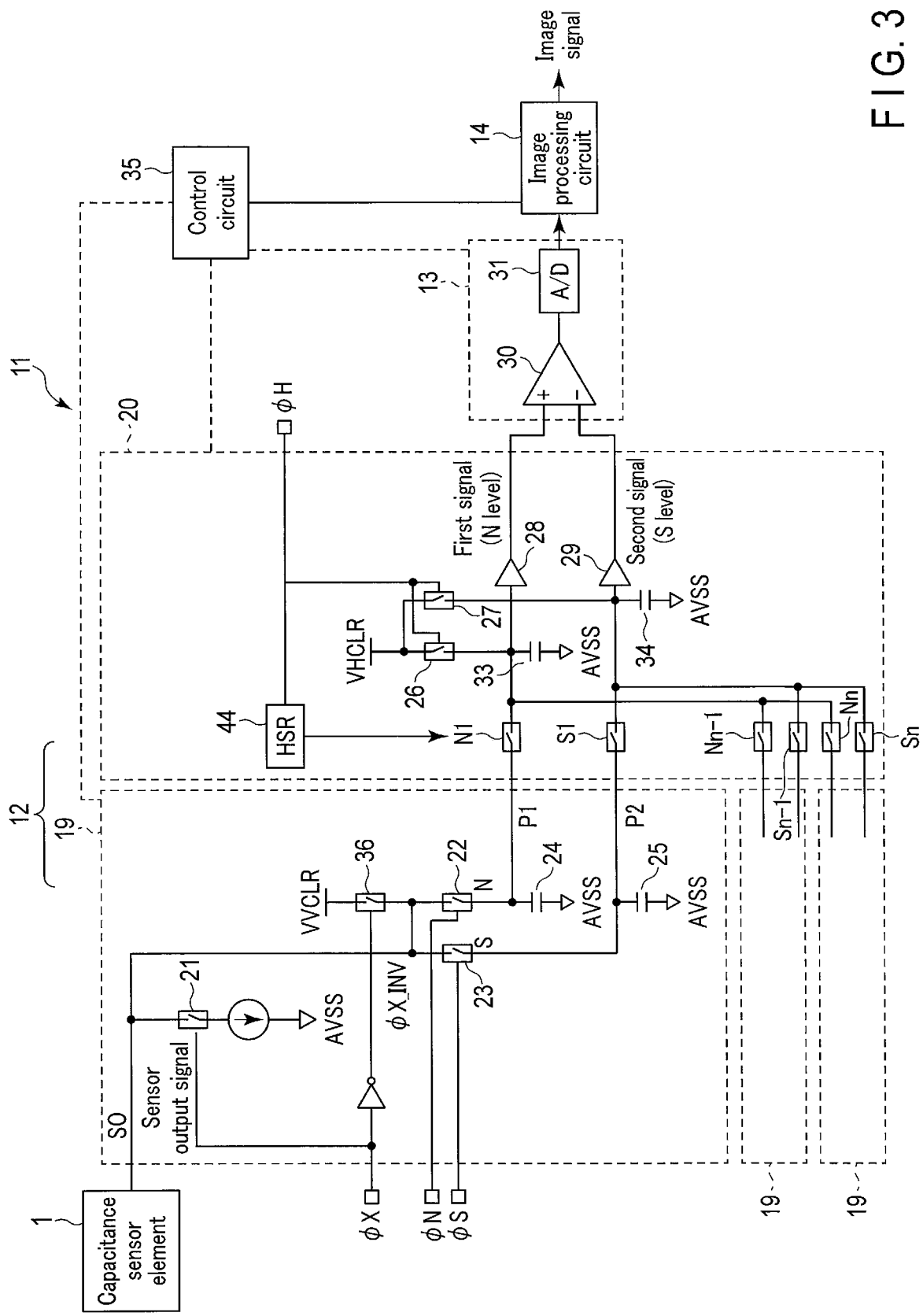
FIG. 3 is a diagram showing a conceptual circuit structure of the sensing signal processing circuit.

The embodiments will be explained in detail below with reference to the drawings.

First, the structure and circuit of a capacitance sensor element of a capacitance detection area sensor according to one aspect of the disclosure will be explained. FIG. 1 shows a circuit structure of a capacitance sensor element according to this aspect, and FIG. 2 shows an exemplary cross-sectional structure of the capacitance sensor element.

As illustrated in FIG. 1, a capacitance sensor element 1 includes a sensor electrode (capacitance detection electrode) 2, a receiving capacitor 3, an amplifier 4, a select switch element 5, a reset element 6, protecting elements 7 and 8 for protecting the amplifier 4 from breakage. These circuit elements are formed into a layered structure on a circuit area 16 in a substrate 15, for example the silicon semiconductor substrate, as illustrated in FIG. 2. An external electrode 10 is a detection target site or a detection target object. A sensing signal is input to the external electrode 10 from a sensing signal source (sensing signal supplying unit) 9.

The sensor electrode 2 is formed of a conductor, such as a metallic film, and is brought close to (but not actually in contact with) the external electrode 10 as the detection target to establish capacitive coupling with the external electrode 10. A protective film having insulation properties against abrasion and corrosion may be formed on the metallic film of the sensor electrode 2. If a protective film is to be formed only on the sensor electrode 2, a conductive protective film may be adopted.

As described later in the first embodiment, the sensor electrode 2 and external electrode 10 are arranged close to and facing each other so as to establish capacitive coupling. The capacitance sensor element 1 detects a change in the charge amount in relation to the capacitance ratio between the sensor electrode 2 and external electrode 10, for example as a change in voltage.

When the sensor electrode 2 conducts a detection through capacitive coupling substantially in a non-contact manner with respect to a detection target object, the sensing signal source 9 applies to the detection target object a sensing signal having a potential changing with time or having an amplitude such as an alternating current signal or a pulse signal. For a detection target object having an electrode such as the external electrode 10, the sensing signal source 9 applies the sensing signal to the external electrode 10.

In the case that a detection target object has an electrical capacitance but a sensing signal cannot be directly applied thereto in the above manner, the sensing signal source 9 applies a sensing signal by positioning the detection target object between the sensor electrode 2 and another counter electrode. In the case of use of such a counter electrode, the detection target object may be immersed in a mediating substance demonstrating conductive properties such as an electrolyte.

If the detection target object has an electrical capacitance (charge), the capacitance sensor element 1 may detect a change in the charge amount based on a change in the capacitance of the detection target object being directly attached to the sensor electrode 2. In the capacitance sensor element 1 according to the present embodiment, a counter electrode is not an essential component, as will be discussed later.

In FIG. 1, AVDD represents a power source voltage, and AVSS represents a reference potential or ground potential, which may be 0V. AV represents an analog signal. VR represents a reset voltage, which may be a reference potential or a certain offset potential.

One of the electrodes of the receiving capacitor 3 is coupled to the sensor electrode 2, while the other electrode is grounded, demonstrating a ground potential (AVSS). The receiving capacitor 3 is a capacitive element configured to be charged up to a potential determined by the capacitance of the receiving capacitor 3, the capacitance of the electrostatic coupling of the external electrode 10 and sensor electrode 2, and the first potential and second potential of the external electrode 10. Here, a signal acquired at the first potential will be referred to as a "first signal", and a signal acquired at the second potential differing from the first potential will be referred to as a "second signal". The first potential may be higher than the second potential. The amplifier 4 may be a source follower-coupled transistor. The gate of this transistor is coupled to the receiving capacitor 3. The amplifier 4 amplifies the voltage read from the receiving capacitor 3 and thereby generates a sensor output signal. This sensor output signal corresponds to the first signal (N level) and second signal (S level), which will be described later.

The select switch element 5 may be a transistor which is driven by a select signal ΦX to read the sensor output signal amplified by the amplifier 4. The reset element 6 may be a transistor which is coupled to the receiving capacitor 3. The reset element 6 is driven by a reset signal ΦR before the detection signal is stored so as to release the charge flown from the outside to the receiving capacitor 3 or the remaining charge, and thereby set the voltage of the receiving capacitor 3 to a reset voltage VR (reference potential or offset voltage). For the transistors serving as the select switch element 5 and reset element 6, MOS transistors (e.g., MOSFETs), which are readily formable, are most suitable if formed on a semiconductor substrate.

The protecting elements 7 and 8 may be diodes, which are elements to protect the internal circuit of the capacitance sensor element 1 from external noise and electrostatic. With the protecting elements 7 and 8 provided, the capacitance sensor element 1 can operate without exceeding the marginal charge capacitance.

The external electrode 10 may be, for example, a conductive pattern including metallic lines formed on a detection target circuit board. A sensing signal (of the first potential or second potential) is applied from the sensing signal source 9 to an electrode pad formed at an end portion of the conductive pattern.

The cross-sectional structure of the capacitance sensor element 1 according to one aspect will be explained with reference to FIG. 2. In FIG. 2, a cross-sectional structure of the capacitance sensor element 1 is conceptually illustrated.

The capacitance sensor element 1 includes a circuit element area 16, for example, with the circuit elements of FIG. 1 formed into a layered structure on the main surface of the silicon semiconductor substrate 15. These circuit elements include the aforementioned receiving capacitor 3, amplifier 4, select switch element 5, reset element 6, and protecting elements 7 and 8. On the circuit element area 16 is a line layer 17 including a plurality of lines with an interlayer insulating film 37 interposed. The line layer 17 mutually couples the circuit elements of the circuit element area 16. The previously mentioned sensor electrode 2 is formed on the line layer 17 with the interlayer insulating film 37 interposed, and exposed as the uppermost surface of the structure. An electrode line 18 electrically couples the sensor electrode 2 to the circuit element area 16. The electrode line 18 is formed in a vertical direction with respect to the main surface of the silicon semiconductor substrate 15 (i.e., in the direction orthogonal to the main surface). The capacitance sensor element 1 according to the present aspect of the disclosure is configured to read a detection signal, employed as an imaging element, through the CMOS system.

The signal processing performed by a capacitance sensor apparatus including the capacitance sensor element 1 to generate image signals from the sensor output of the capacitance sensor element 1 will be explained with reference to FIGS. 3 and 4A. FIG. 3 is a diagram showing a conceptual circuit structure of the capacitance sensor apparatus. As illustrated in FIG. 3, the capacitance sensor apparatus includes the capacitance sensor element 1 and a sensing signal processing circuit 11. The capacitance sensor element 1 may have a structure illustrated in FIGS. 1 and 2. The explanation of the capacitance sensor element 1 is omitted here.

The sensing signal processing circuit 11 includes a reading circuit 12, a differential signal generating circuit 13, an image processing circuit 14, and a control circuit 35. The control circuit 35 respectively controls the reading circuit 12, differential signal generating circuit 13, and image processing circuit 14.

The reading circuit 12 includes a sample-hold circuit 19 and an output switching circuit 20. The sample-hold circuit 19 acquires a sensor output signal from the capacitance sensor element 1. The output switching circuit 20 switches the outputs of the sample-hold circuit 19, and amplifies the first signal and the second signal to output to the differential signal generating circuit 13.

The sample-hold circuit 19 is arranged for each row. The sample-hold circuit 19 includes a sampling switch 21, a first signal acquisition switch 22 (hereinafter referred to as "first switch 22"), a second signal acquisition switch 23 (hereinafter referred to as "second switch 23"), a first signal capacitor 24, a second signal capacitor 25, and a signal clear switch 36 (hereinafter referred to as "sample-hold clear switch 36").

In this sample-hold circuit 19, the output terminal of the capacitance sensor element 1 is coupled to one terminal of the sampling switch 21, one terminal of the sample-hold clear switch 36, the input terminal of the first switch 22, and the input terminal of the second switch 23. The output terminal of the first switch 22, one terminal of the first signal capacitor 24, and the input terminal of the switch N for switching the output of the sample-hold circuit 19 are mutually coupled at the first coupling point P1. Similarly, the output terminal of the second switch 23, one end of the second signal capacitor 25, and the input terminal of the switch S for switching the output of the sample-hold circuit 19 are mutually coupled at the second coupling point P2.

The input terminal of the sampling switch 21 is coupled to the output terminal of the capacitance sensor element 1 and the input terminals of the first switch 22 and second switch 23, while the output terminal of the sampling switch 21 is coupled to a load (constant current circuit). The sampling switch 21 is switched in response to a select signal ΦX to set a sampling period. During this sampling period, the sampling switch 21 outputs a sensor output signal received from the capacitance sensor element 1 to the first switch 22 and the second switch 23.

The input terminal of the first switch 22 is coupled to the output terminal of the capacitance sensor element 1, while the output terminal of the first switch 22 is coupled to the aforementioned first coupling point P1. The first switch 22 is switched in response to the first signal acquisition signal (first sample-hold signal) ΦN, and outputs a first signal (N level) during the sampling period.

The input terminal of the second switch 23 is coupled to the output terminal of the capacitance sensor element 1, while the output terminal of the second switch 23 is coupled to the aforementioned second coupling point P2. The second switch 23 is switched in response to a second signal acquisition signal (second sample-hold signal) ΦS, and outputs a second signal (S level) during the sampling period. The first signal acquisition signal (or first sample-hold signal) ΦN and the second signal acquisition signal (or second sample-hold signal) ΦS are switch drive signals for sequentially generating the first signal and second signal during the sampling period.

The first signal capacitor 24 stores the first signal N generated by the first switch 22. Similarly, the second signal capacitor 25 stores the second signal S generated by the second switch 23.

Furthermore, the sample-hold clear switch 36 is switched in response to a select signal ΦX_INV, which is an inversion signal of the select signal ΦX, prior to the operations of the first switch 22 and second switch 23. Then, the first switch 22 and second switch 23 are operated, setting both a potential of the first signal capacitor 24 and a potential of the second signal capacitor 25 to the reference potential (VVCLR).

Next, the output switching circuit 20 will be explained.

The output switching circuit 20 includes a first signal clear switch (hereinafter referred to as "output capacitor clear switch") 26, a second signal clear switch (hereinafter referred to as "output capacitor clear switch") 27, a first signal amplifier 28, a second signal amplifier 29, a first signal outputting capacitor 33, a second signal outputting capacitor 34, and a horizontal shift register (HSR) 44. The shift register (HSR) 44 drives switches N1 through Nn and S1 through Sn, which serve to switch the signals of the outputs (P1, P2) of the sample-hold circuit.

The output switching circuit 20 sequentially switches the switches S1 through Sn and N1 through Nn coupled to each of the sample-hold circuits 19 so that the charges carried in the first signal capacitor 24 and second signal capacitor 25 are transferred to the first signal outputting capacitor 33 and second signal outputting capacitor 34. One terminal of the first signal outputting capacitor 33 is coupled to the reference potential (VHCLR) by way of the output capacitor reset switch 26, while the other terminal of the first signal outputting capacitor 33 is coupled to the reference potential (AVSS).

One terminal of the second signal outputting capacitor 34 is coupled to the reference potential (VHCLR) by way of the output capacitor reset switch 27, while the other terminal of the second signal outputting capacitor 34 is coupled to the reference potential (AVSS). When the output capacitor reset switches 26 and 27 are turned on, the first signal outputting capacitor 33 and second signal outputting capacitor 34 are discharged. The first signal amplifier 28 amplifies the first signal N. The second signal amplifier 29 amplifies the second signal S.

The differential signal generating circuit 13 includes a differential calculator 30 and an AD converter 31, and amplifies and outputs the difference signal between the first signal and second signal output from the reading circuit 12. This differential signal generating circuit 13 is configured to execute a digital conversion at an AD converter 31 upon the differential signal output from the differential calculator 30. Alternatively, the differential signal generating circuit 13 may be configured to digitally convert the first signal and second signal at two AD converters 31, and then calculate, on a software program, a difference of the signals from the outputs of the conversion (although such a structure is not illustrated). FIG. 4B shows the output timings of the output switching circuit 20. Upon application of the first potential from the external electrode 10, the capacitance sensor element 1 outputs a voltage of a certain level of a sensor output signal, for example N level. The first signal N is a signal acquired when the external electrode 10 is at the first potential. The second signal S is a signal acquired when the external electrode 10 is at the second potential.

The image processing circuit 14 generates an image signal corresponding to the level of the differential signal. The image processing circuit 14 performs image processing such as γ correction, edge detection, and image matching. The voltage detection and image processing of the capacitance sensor element 1 will be explained by referring to the time charts of FIGS. 4A and 4B and flowchart of FIG. 5.

Figure 4A:
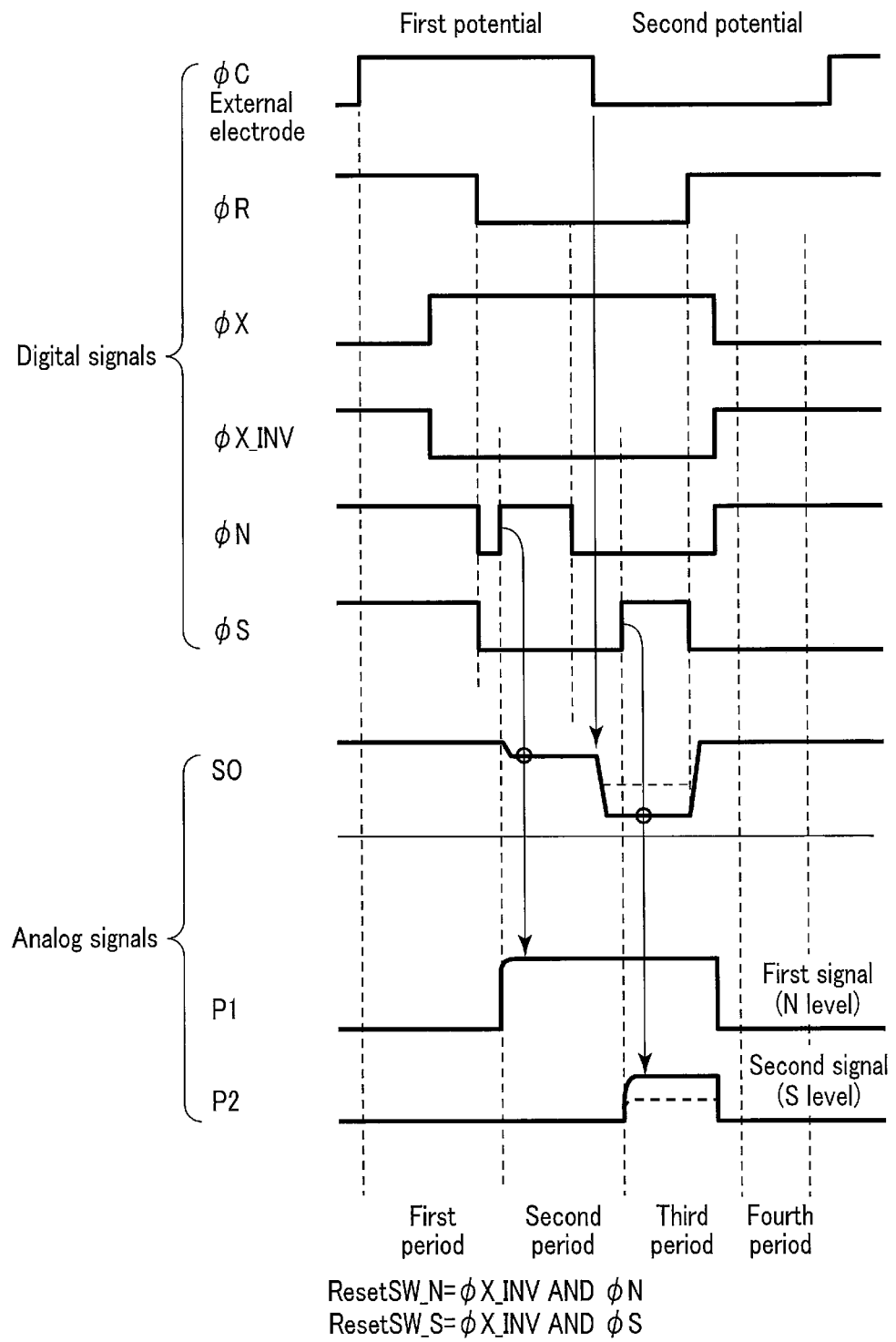
FIG. 4A is a diagram showing waveforms of a reset signal ΦR, a select signal ΦX, a first signal acquisition signal ΦN, a second signal acquisition signal ΦS, a first signal (N level) and a second signal (S level) of the sensing signal processing circuit.
Figure 4B:
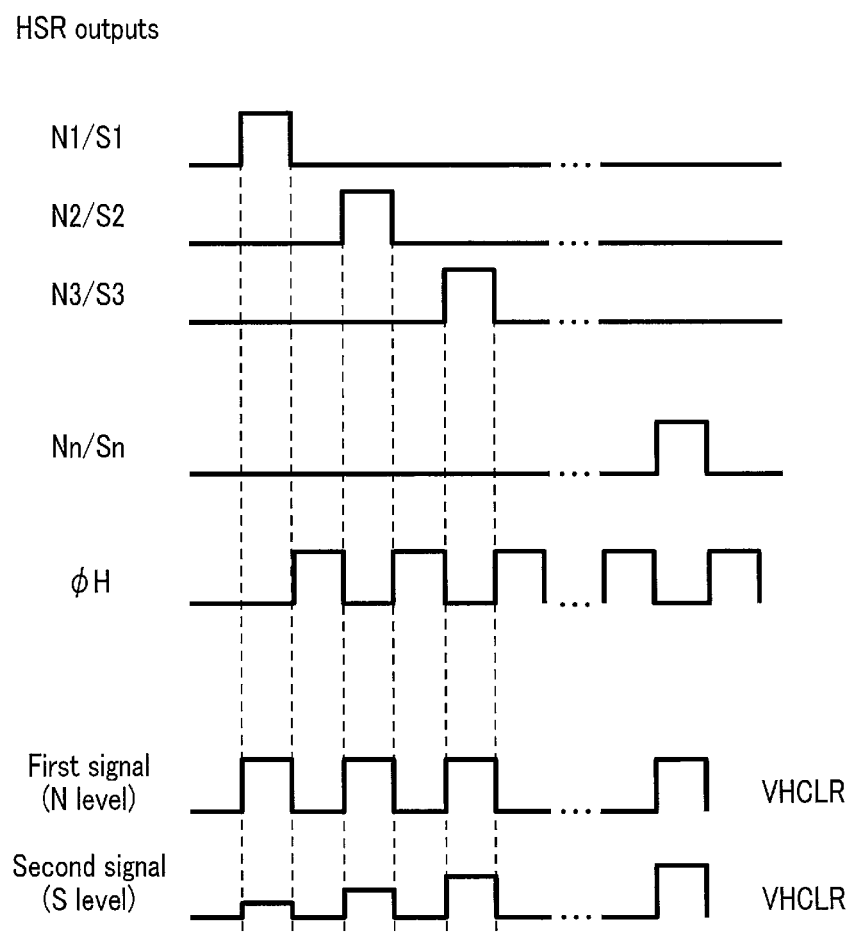
FIG. 4B is a diagram showing output timings at a horizontal shift register (HSR).
Figure 5:
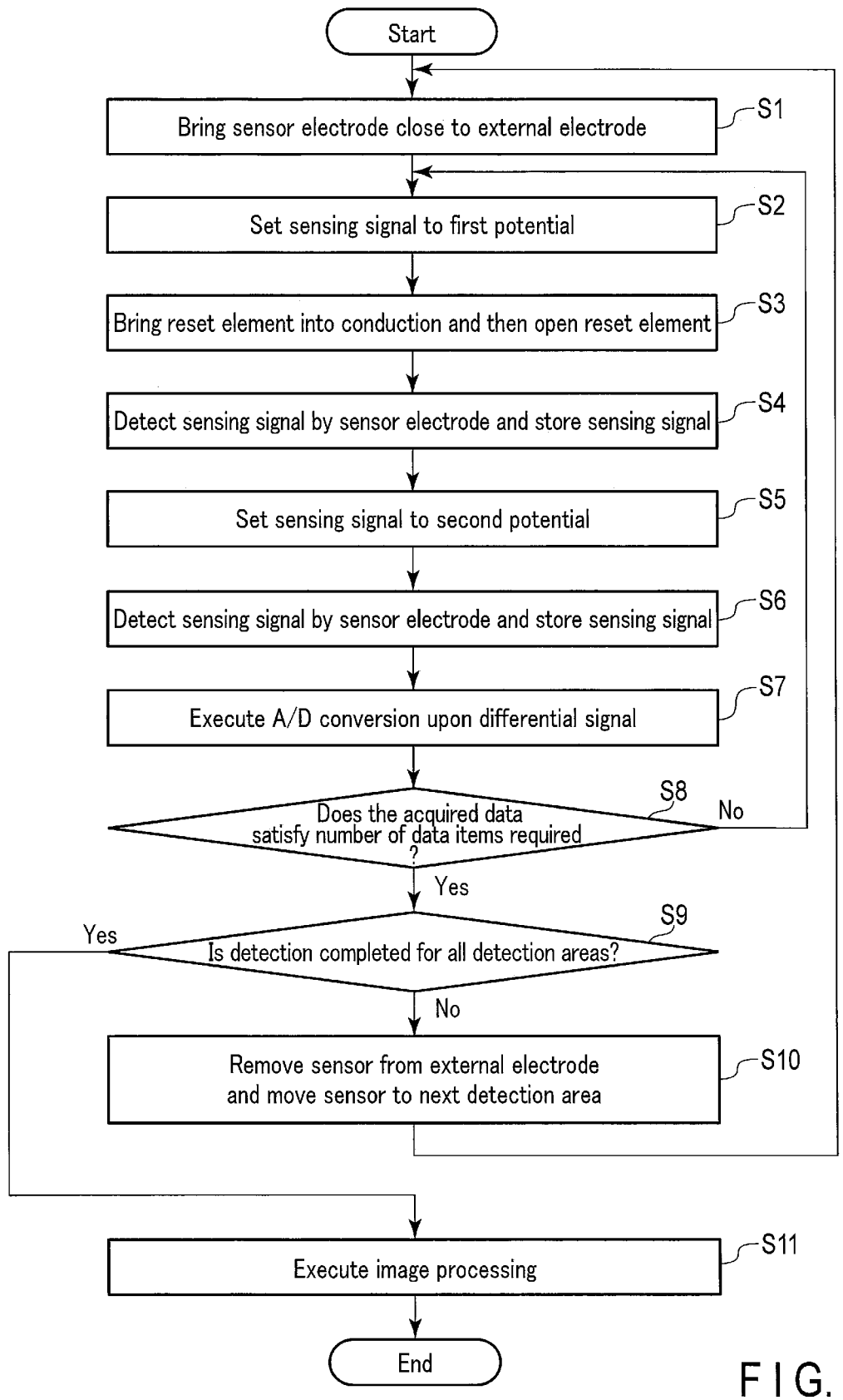
FIG. 5 is a flowchart explaining the detection of a sensing signal at the capacitance sensor elements.

FIG. 4A shows the output waveforms of the reset signal ΦR, select signal ΦX, first signal acquisition signal ΦN, second signal acquisition signal ΦS, and the first signal (P1) and second signal (P2) of the sample-hold circuit 19. FIG. 4A indicates the first to fourth periods of each operation. In the terminology used for the following explanation, the first signal denotes a signal acquired when the first potential is applied to the external electrode 10. Here, the first signal corresponds to the reset voltage VR of the receiving capacitor 3. The second signal denotes a signal acquired when the second potential is applied to the external electrode 10. Here, the second signal corresponds to the reset voltage VR−Cs/(Cs+Cc)·(first potential−second potential), where Cs is the capacitance between the external electrode 10 and the sensor electrode, and Cc is the capacitance of the receiving capacitor.

First, the sensor moving unit 56 brings the sensor electrode 2 close to the detection target external electrode 10 (step S1). Next, the control circuit 35 applies the first potential of the sensing signal from the sensing signal source 55 to the external electrode 10 (step S2). Thereafter, the control circuit 35 sets the reset signal ΦR to H level to drive the reset element 6 (step S3). Here, the control circuit 35 sets the reset signal ΦR to H level, the select signal ΦX to L level, the first signal acquisition signal ΦN to H level, and the second signal acquisition signal ΦS to H level. The reset element 6 sets the receiving capacitor 3 to the reset voltage VR (reference potential or offset voltage). Thereafter, the control circuit 35 sets the select signal ΦX to H level to drive the select switch element 5. The capacitance sensor element 1 outputs a sensor element output SO at a voltage corresponding to the reset voltage VR. Steps S2 and S3 correspond to the first period (reset period) in FIG. 4A.

Next, the control circuit 35 determines the reset element 6 to be non-conductive and switches the first signal acquisition signal ΦN sequentially from L level to H level. The control circuit 35 further switches the second signal acquisition signal ΦS to L level. The first switch 22 is turned on in response to the input of the first signal acquisition signal ΦN at H level. With the first switch 22 in a conductive state, the first signal is stored in the first signal capacitor 24 (step S4). Step S4 corresponds to the second period (first signal acquisition period) in FIG. 4A.

Next, the control circuit 35 applies the second potential to the external electrode 10 (step S5). The potential of the receiving capacitor 3 of the capacitance sensor element 1 is determined by the capacitance of the receiving capacitor 3, the capacitance of the electrostatic coupling of the external electrode 10 and sensor electrode 2, and the difference between the first potential and second potential of the external electrode 10. At this timing, the select signal ΦX is at H level. The select switch element 5 therefore maintains the ON state. For this reason, the capacitance sensor element 1 outputs, as a sensor element output SO, the second signal at the voltage maintained in the receiving capacitor 3 of the capacitance sensor element 1. Thereafter, the control circuit 35 inputs the second signal acquisition signal ΦS of H level to the second switch 23 to turn on the second switch 23. With the second switch 23 in a conductive state, the second signal is stored in the second signal capacitor 25 (step S6). Steps S5 and S6 correspond to the third period (second signal acquisition period) in FIG. 4A.

Thereafter, the sample-hold circuit 19 sequentially turns on, by the shift register (HSR) arranged in the output switching circuit 20, the output switches N1 through Nn and S1 through Sn. The first signal and second signal are thereby read from the first signal capacitor 24 and second signal capacitor 25, respectively. The read-out first signal and second signal are transferred to the first signal outputting capacitor 33 and second signal outputting capacitor 34, respectively, to be stored therein.

The control circuit 35 further reads, at the same timing, the first signal and second signal from the first signal outputting capacitor 33 and second signal outputting capacitor 34, respectively. After being amplified as appropriate by the first and second signal amplifiers 28 and 29, the read-out first signal and second signal are output to the differential signal generating circuit 13. The differential signal generating circuit 13 outputs the differential signal of the first signal and second signal. This differential signal is converted to a digital signal by the AD converter 31 and captured into the image processing circuit 14 (step S7). Step S7 corresponds to the fourth period (signal call period) in FIG. 4A. Following output, the first signal outputting capacitor 33 and second signal outputting capacitor 34 are set to the reference potential, with the output capacitor reset switches 26, 27 being in a conductive state.

Next, the control circuit 35 determines whether or not the acquired differential signals satisfy the number of data items required (step S8). If the differential signals do not satisfy the number of data items required at the determination of step S8 ("NO"), the process returns to step S2. Then, the acquisition of sensor output signals from the capacitance sensor element 1 and the output of differential signals are repeated until the differential signals satisfies the number of data items required at step S8. When the differential signals satisfy the number of data items required ("YES"), the control circuit 35 determines whether the detection is completed for all the detection areas (step S9). If the detection is not yet completed for all the detection areas at the determination of step S9 ("NO"), the sensor moving unit 56 moves the sensor electrode 2 away from the external electrode 10 and toward the next detection area (step S10). Thereafter, the process returns to step S1, as explained above, at which the detection is conducted. If the detection of all the detection areas is completed at the determination of step S9 ("YES"), the image processing circuit 14 executes image processing (step S11).

FIG. 6 is a diagram showing a conceptual circuit structure of the capacitance detection area sensor according to the present embodiment, in which capacitance sensor elements are two-dimensionally arrayed. For the structural components of this capacitance detection area sensor, the same reference numerals are assigned to the same components as the structural units illustrated in FIG. 3, and the explanation of these components is omitted.

The capacitance detection area sensor circuit (hereinafter referred to as "area sensor") 80 includes a plurality of capacitance sensor elements 1, for example in a matrix of 256 rows×256 columns (two-dimensional array). This, however, does not limit the chip size of the area sensor 80 or the number of capacitance sensor elements 1. In addition, the shape of the area sensor 80 can be designed as appropriate in accordance with the shape of a detection target, such as a square or rectangle. Each of the capacitance sensor elements 1 in a matrix arrangement is coupled to a sensor element selection circuit constituted by a vertical shift register (VSR) 46 and a horizontal shift register (HSR) 44.

In each of the capacitance sensor elements 1, the input terminal for a select signal ΦX is coupled to a select signal (ΦX) line 41 that serves as a row line, and the input terminal for a reset signal ΦR is coupled to a reset signal (ΦR) line 42. Each of the output terminals of the capacitance sensor element 1 are coupled to a sensor output lines 43 that serve as column lines. The select signal lines 41 and reset signal lines 42 are coupled to the vertical shift register (VSR) 46. The sensor output lines 43 are coupled to the sample-hold circuits 19.

To the vertical shift register 46, a vertical shift register clock ΦV, a vertical shift register start pulse ΦVS and a vertical shift register reset pulse ΦVR may be input as drive control signals.

In addition, a horizontal shift register clock ΦH, a horizontal shift register start pulse ΦHS and a horizontal shift register reset pulse ΦHR may be input as drive control signals to the horizontal shift register (HSR) 44 so that the horizontal shift register (HSR) 44 can control the output timings of the sample-hold circuits 19 through switching.

As mentioned above, the sensor output signals sequentially read from the selected capacitance sensor element 1, in response to the select signal ΦX, are temporarily input to the sample-hold circuits 19. The sample-hold circuits 19 hold the sensor output signals at the timings of the first signal acquisition signal ΦN and second signal acquisition signal ΦS.

The sensor output signals read from the sample-hold circuits 19 by the horizontal shift register (HSR) 44 are output to the first signal amplifier 28 and second signal amplifier 29 as mentioned above. Thereafter, the first signal and second signal are amplified by the first signal amplifier 28 and second signal amplifier 29, and a differential signal of the first signal and second signal is thereby generated by the differential signal generating circuit 13 of FIG. 3. The differential signal is converted to an image signal by the image processing circuit 14.

Figure 7:
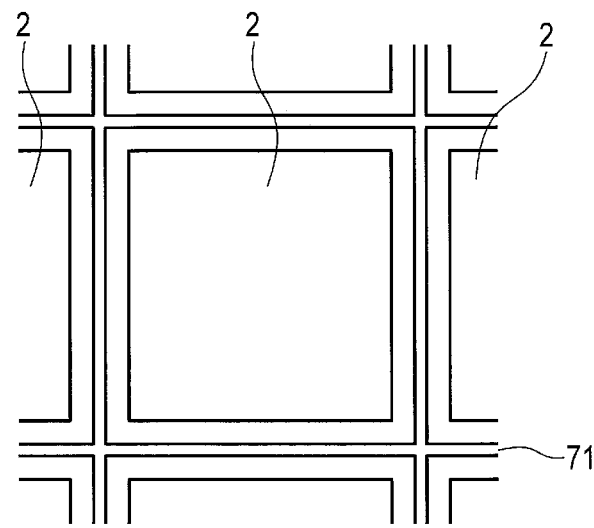
FIG. 7 is a diagram showing an outer appearance of the area sensor when viewed from above.
Figure 8:
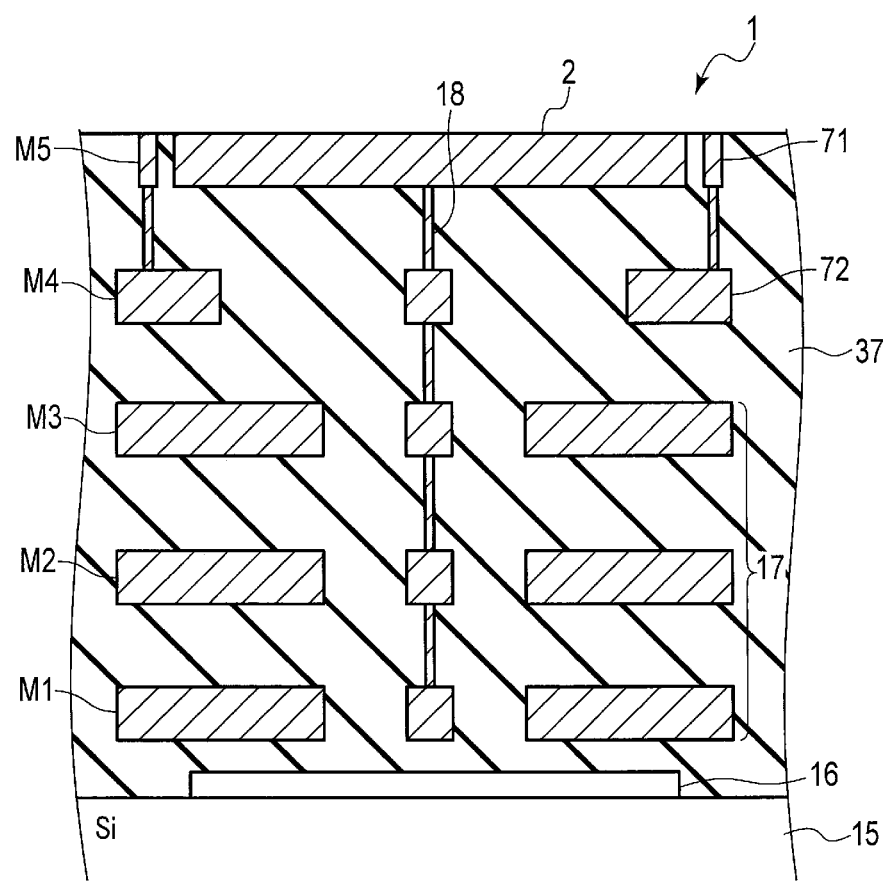
FIG. 8 is a diagram showing a cross-sectional structure of a capacitance sensor element that constitutes the area sensor.

FIG. 7 is a diagram showing the outer appearance of the area sensor 80 when viewed from above, and FIG. 8 is a diagram showing a cross-sectional structure of a capacitance sensor elements 1 that constitutes the area sensor 80.

In the example of FIG. 7, a sensor electrode 2 is shaped into a square. One side of the sensor electrode 2 is approximately 10 μm. As illustrated in FIG. 8, a frame-like shield electrode (M5) 71 is formed to be slightly separated for insulation from the periphery of a sensor electrode 2 and embedded in a manner to surround the sensor electrode 2. The shield electrode 71 is coupled to an internal line (M4) 72. The shield electrode 71 has a function of reducing the influences that an electric field diagonally above the sensor electrode 2 and adjacent sensor electrodes 2 may exert upon capacitance detection. The potential of the shield electrode 71 is set to approximately the ground potential.

As illustrated in FIG. 8, the circuit element area 16 including the circuit element of FIG. 1 is formed on the silicon semiconductor substrate 15. Multiple metallic line layers (M1, M2, M3) 17 and electrode line 18 are formed above the circuit element area 16 with insulating layers interposed (not shown). The area of the circuit element area 16 when viewed in the projecting direction from above is smaller than that of the sensor electrode 2. Since the circuit element area 16 is arranged beneath the sensor electrode 2, the proximate arrangement of adjacent sensor electrodes 2 is possible. As a result, an area sensor 80 exhibiting high density can be realized.

Through the correlated double sampling of the reading circuit 12 and differential signal generating circuit 13, the area sensor 80 can remove components of frequencies longer than the sampling time Δt from the fluctuation of the external electrode AVSS and superimposed noises. With respect to the fluctuation of the reset voltage and noise in the signal, fluctuation and noise kept in the storage element of the capacitance sensor element can be removed upon each reset. With regard to the thermal noise of the ON resistance of the reset switch, thermal noise kept in the storage element of a capacitance sensor element can be removed upon each reset. With regard to the fluctuation of the threshold voltages of the first and second signal amplifiers 28 and 29, serving as cell amplifiers, the offsets of direct current components of the output voltage can be removed. With regard to the low-frequency noises in the first and second signal amplifiers 28 and 29, components of frequencies longer than the sampling time Δt can be removed. In addition, with regard to the operating point of the drain voltage of a column current source, offsets of the direct current of the output voltage can be removed.

Figure 9:
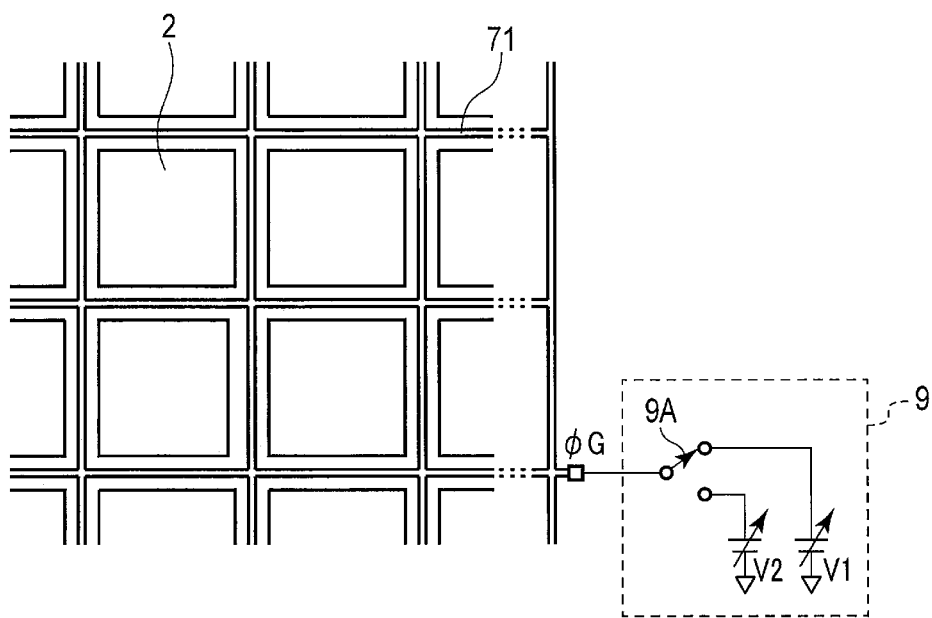
FIG. 9 is a diagram showing an exemplary structure using a shield electrode as an external electrode.

In FIG. 7, the potential of the shield electrode 71 is assumed to be approximately the ground potential, which is not a limitation. The shield electrode 71 may be either of the aforementioned first potential or second potential. That is, the shield electrode 71 may be used as an external electrode 10. FIG. 9 is a diagram showing an exemplary structure using the shield electrode 71 as an external electrode 10. In the example of FIG. 9, the shield electrode 71 is formed in the periphery of each of the sensor electrodes 2, and this shield electrode 71 is provided with a terminal ΦG coupled to the sensing signal source 9. The sensing signal source 9 in the example of FIG. 9 is configured to apply either the first potential V1 or second potential V2 to the shield electrode 71 via the terminal ΦG through the switching of a switch 9A. With this structure, the external electrode 10 is not required.

In the examples of FIGS. 7 and 9, the shield electrode 71 is shaped into a frame surrounding a square sensor electrode 2. The shield electrode 71, however, need not be square-shaped. If the sensor electrode 2 is for example rectangular, a rectangular shield electrode 71 may be arranged along with the sensor electrode 2. If the sensor electrode 2 is a comb electrode, the shield electrode 71 may be a comb electrode engaged with this sensor electrode 2.

First Embodiment

FIG. 10 is a diagram showing a conceptual structure of a conductive pattern sensing apparatus incorporating the capacitance detection area sensor. FIG. 11 is a diagram showing an exemplary conductive pattern image based on normal conductive pattern information used as a determination reference. FIG. 12 provides diagrams showing conductive pattern images of detection targets explaining the detection of the presence/absence of a defect and the detection of the position of the defect based on image matching.

The conductive pattern sensing apparatus 51 includes an area sensor (capacitance detection area sensor circuit) 80, a differential signal generating circuit 13, an image processing circuit 14, a storage 58, a comparison unit 59, a defect position information acquisition unit 60, a display 61, an input unit 62, an interface 63, a selector 81, a probe 82, a switch 83, sensing signal sources 55, a sensor moving unit (sensor moving mechanism) 56, a controller 64, and a timing control circuit 65.

The area sensor 80 is the same as the aforementioned area sensor of FIG. 6. The area sensor 80 is arranged at a position facing a conductive pattern 101 of the circuit board 100 in substantially a non-contact manner. In order to protect the area sensor 80 from damage and wear, an extremely thin protective film (insulating film) is deposited to cover the entire surface where the electrodes of the area sensor 80 and the like are arranged. For this reason, even if the area sensor 80 is brought into contact with the conductive pattern 101, the sensor electrode 2 will not practically be in contact with the conductive pattern that serves as an external electrode. This arrangement is referred to as "practically non-contact".

Upon receipt of a detection signal from the area sensor 80, the differential signal generating circuit 13 generates a differential signal. The differential signal generating circuit 13 may be incorporated into the area sensor 80. The image processing circuit 14 generates image data based on the differential signal. The image processing circuit 14 executes image processing upon the binary differential signal output from the controller 64, thereby generating a conductive pattern image including a conductive pattern 101.

The storage 58 stores the positional information of a sensing target area. In general, the sensing area (effective sensing area) of the area sensor 80 is smaller than the area of the conductive pattern 101 of the circuit board 100. For this reason, sensing target areas divided in accordance with the sensing areas of the area sensor 80 are defined on the conductive pattern 101 of the circuit board. That is, a plurality of divided conductive patterns are present in the sensing target areas. The sensing target areas are determined such that their edges are slightly overlapping each other. That is, the sensing target areas are defined such that, when imaging the acquired data through the image processing, image overlapping portions are included to serve as tabs for attachment of images to one another.

Through an image matching process of the image data of the conductive pattern 101 generated by the image processing circuit 14 and reference conductive pattern image data, the comparison unit 59 determines defectiveness or otherwise of the conductive pattern 101. The reference conductive pattern image data presents image data of a normal conductive pattern without breakage, short-circuiting, chipping and the like.

The selector 81 switches the probes 82 for the output of sensing signals. The selector 81 performs the switching of the probes 82 based on a control signal supplied from the timing control circuit 65 in a manner such that a sensing signal will be supplied to each one of the independent conductive patterns 101 on the circuit board 100. The selector 81 may be constituted by a multiplexer, demultiplexer and the like.

The tip of each probe 82 is brought into contact with an end of a conductive pattern 101 on the circuit board 100. Each of the probes 82 supplies a sensing signal to the conductive pattern 101. When initiating a detection with the circuit board 100 set, these probes 82 are brought into contact with the electrodes at a time prior to the detection. The probes 82 are coupled to the sensing signal sources 55 via the switch 83. The first signal and second signal, acquired from the area sensor at the time of outputting the first potential and second potential of the conductive pattern in accordance with the sensing signal supplied from the probe 82, are output as detection signals to the controller 64 by way of the differential signal generating circuit 13 and image processing circuit 14.

The switch 83 switches the sensing signal sources 55 coupled to a probe 82. The sensing signal sources 55 are configured to supply a sensing signal for the first potential and the second potential. Through the switching of the switch 83 by the timing control circuit 65, the sensing signal sources 55 supply the sensing signal of the first potential or second potential to the conductive pattern 101.

The sensor moving unit 56 moves the area sensor to the sensing position of the circuit board (printed circuit board or PCB). The sensor moving unit 56 repeats a detection of the circuit board 100 sequentially upon the divided sensing target areas by moving the area sensor 80. The distance of the area sensor 80 from the facing conductive pattern 101 is preferably 0.02 mm or smaller; more realistically, 0.5 mm or smaller.

For the controller 64, a personal computer or central processing unit (CPU) that can control the entire apparatus to issue the necessary commands and perform computing functions may be adopted.

The timing control circuit 65 controls the switching timing of the selector 81 and the application timing of the sensing signal sources 55. For the selector 81, the timing control circuit 65 controls the control signal for selection of a probe and the detection voltage to be applied to a conductive pattern. The timing control circuit 65 supplies a synchronization signal to drive the area sensor 80 in synchronism with the control signal supplied to the selector 81.

In the circuit board 100 of FIG. 10, the conductive pattern 101 is arranged only on one surface of the board. The conductive patterns 101, however, may be arranged on the front and back surfaces. When the conductive patterns 101 are arranged on the two surfaces, two area sensors 80 are positioned in a manner such that their sensor surfaces will face, at a certain distance apart, the respective surfaces on which the conductive patterns 101 are provided so that the surfaces of the circuit board with the conductive patterns 101 are sandwiched. With such an arrangement, the front and back conductive patterns 101 can be simultaneously sensed. Alternatively, a circuit board flipping mechanism may be provided in the conductive pattern sensing apparatus 51. If this is the case, after sensing the front surface of the conductive pattern, a half turn is made on the circuit board 100 by the circuit board flipping mechanism so that the circuit board 100 can be flipped over. Then, the conductive pattern on the back surface of the circuit board 100 can be sensed.

According to the present embodiment, the circuit board 100 includes a comb-shaped conductive pattern 101 that extends from the electrode pad 104 and linearly branches into multiple branches. The comb-shaped conductive pattern is explained as an example here, but is not a limitation. The conductive pattern for implementing a commonly-used electronic part may be adopted.

Figure 11A:
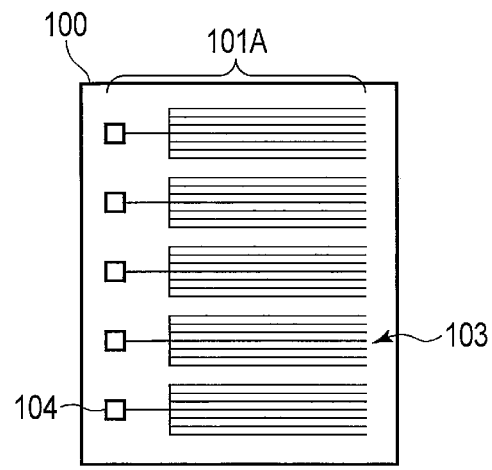
FIG. 11A is a diagram showing an exemplary conductive pattern image based on normal conductive pattern information used as a determination reference.
Figure 11B:
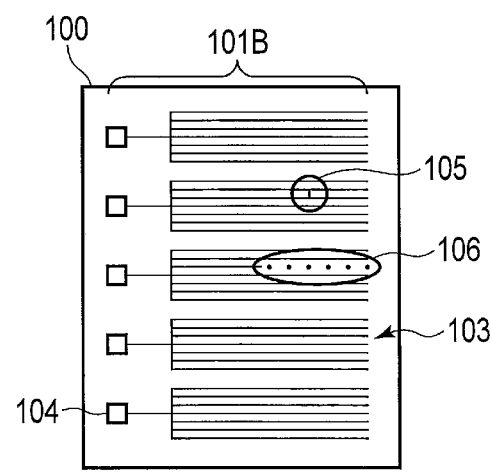
FIG. 11B is a diagram showing an exemplary conductive pattern image obtained through a detection.

FIGS. 11A and 11B show exemplary conductive pattern images rendered by the image processing circuit 14, in which a conductive pattern 101 is included. FIG. 11A shows a normal conductive pattern that serves as a determination reference containing no defect, while FIG. 11B shows an exemplary conductive pattern that has defects such as short-circuiting and breaks. In these diagrams, black areas represent lines of the conductive pattern, and white areas represent areas of the conductive pattern with no line formed thereon.

The two-color image illustrated as the example is not limited to black and white, and the image may be presented in two or more colors, or in two or more tones. The line 106 illustrated by a dotted line in FIG. 11B is an area of a conductive pattern to which a sensing signal is not supplied due to breaks (breaking defects). The line is therefore illustrated in white indicating a missing portion on the created image, even though the line is present in actuality. To the short-circuited portion (shorting defect) 105, a sensing signal is supplied, and this portion therefore appears as an image of a line.

The storage 58 stores programs and applications employed by the controller 64. The storage 58 further stores image information of the reference conductive pattern image 101A created from the normal conductive pattern of FIG. 11A for use as a determination reference at the comparison unit 59. The reference conductive pattern image 101A is stored for each of detection targets having different patterns.

The comparison unit 59 compares, through pattern matching, the detection conductive pattern image 101B of FIG. 11B acquired as a sensing result output from the image processing circuit 14 with the reference conductive pattern image 101A of FIG. 11A read from the storage 58, and extracts abnormal portions such as a broken portion 106 and short-circuited portion 105 to determine defectiveness/non-defectiveness. The comparison unit 59 stores the determination result in the storage 58 and displays the determination result on the display 61.

The controller 64 acquires positional information or coordinate information determined by the comparison unit 59 to contain a defect and stores it in the storage 58 together with the determination result. This positional information will be used by a repairing device when repairing the conductive pattern 103 in downstream processing.

The display 61 is a display device, such as a liquid crystal display, which displays at least information relating to conductive pattern sensing acquired by the controller 64, the reference conductive pattern image 101A and detection conductive pattern image 101B output by the image processing circuit 14, and the results of the defectiveness determination.

As the results of the defectiveness determination, the reference conductive pattern image 101A serving as a determination reference and the detection conductive pattern image 101B are preferably either displayed side by side on a single screen or superimposed on each other in different colors. If there is a break in the detection conductive pattern image 101B, the line may be present but a sensing signal cannot be supplied due to the break. Because the area sensor 80 does not detect a sensing signal, a conductive pattern sensing image 123 is created in which the line is missing. Comparison on the display with the conductive pattern reference image 113 representing a normal reference image helps ensure that a defective portion will not be overlooked.

The input unit 62 may be constituted by a keyboard or switch panel. Alternatively, the input unit 62 may be a touch panel arranged on the display panel of the display 61. The input unit 62 inputs information relating to the sensing of conductive patterns and settings for selection.

The interface 63 includes an interface for establishing communications between the conductive pattern sensing apparatus 51 and the server of the repairing device via a communication network such as LAN and the Internet in order to share the sensing information and the like.

By referring to FIGS. 12A to 12E, examples of the conductive patterns that can be sensed by the conductive pattern sensing apparatus according to the present embodiment will now be described.

FIG. 12A shows a linear conductive pattern 110. In this example, the conductive pattern 110 including a broken portion 111 is illustrated. Visual confirmation of a break condition and the scale of the break (e.g., length of the missing portion) on an image can also help determine whether or not the break is indeed repairable.

FIG. 12B shows a conductive pattern 120 in which a circular loop pattern is formed between two electrodes. With this conductive pattern 120 having two current paths between the electrodes, current can still flow through one path even if the other is broken. This means that with a conventional sensing technique in which the sensing terminals are brought into contact to supply a sensing signal between the electrodes, a difference between the presence and absence of a break does not demonstrate a sufficient difference in the sensing values to detect a breaking defect.

In contrast, according to the present embodiment, as long as a sensing signal can be applied, the potential in a conductive pattern to which the sensor electrodes face can be detected by the sensor electrode from the conductive pattern except for the broken portion. Thus, a breaking defect portion 121 in a loop pattern can be detected and presented as an image.

Figure 12C:
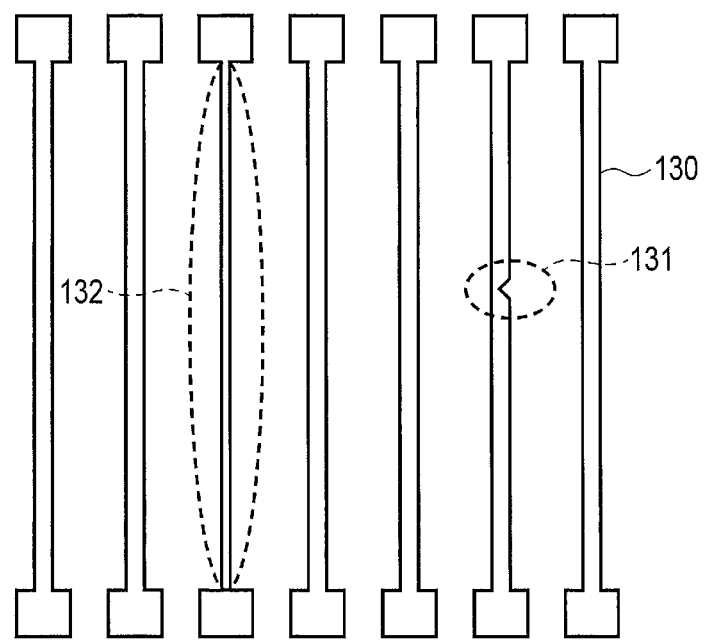
FIG. 12C is a diagram showing a plurality of linear conductive patterns arranged in parallel.

FIG. 12C shows multiple conductive patterns 130 that linearly extend in parallel. If a conductive pattern includes a thinned portion 132 or a chipped portion 131, such a defect cannot be detected with a conventional sensing that adopts sensing signals between two electrodes. Even at a product inspection after assembly into a product, the defective portion may still not appear as a defect. For instance, defects may be caused by a break due to thermal stress or current crowding, or the peeling (uplifting) of a conductive pattern from the circuit board in accordance with a change with time. In contrast, according to the present embodiment, as a conductive pattern can be acquired as an image, a thinned portion and chipped portion can be easily found in the conductive pattern.

Figure 12D:
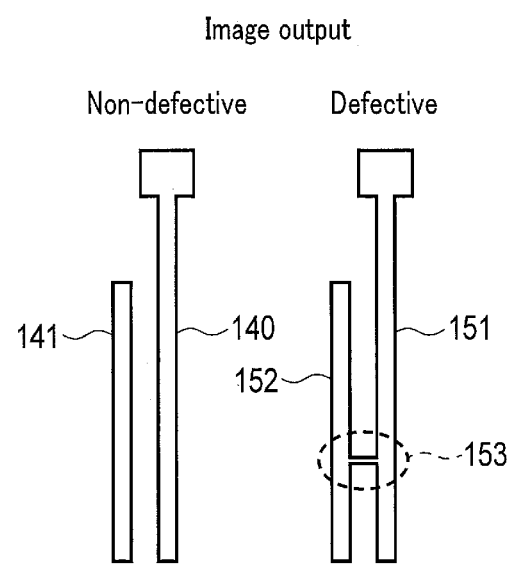
FIG. 12D is a diagram showing conductive patterns arranged close to a floating pattern.

FIG. 12D shows conductive patterns arranged adjacent to floating patterns. The conductive pattern 140 and floating pattern 141 are electrically separated. In this drawing are illustrated a conductive pattern 140 and a floating pattern 141 of a non-defective product to be used as a determination reference, and a conductive pattern 151 containing a shorting defect 153 and a floating pattern 152. A defect in this conductive pattern 151 cannot be detected by conventional sensing using a sensing signal supplied between two electrodes. To detect such a shorting defect, additional electrodes need to be arranged to the floating pattern 152.

On the other hand, according to the present embodiment, a conductive pattern can be acquired as an image. Thus, if a potential can be applied between the electrodes even to a portion that is not a current path, the conductive pattern and floating pattern can be acquired as an image, and a shorting defect can thereby easily be detected.

Figure 12E:
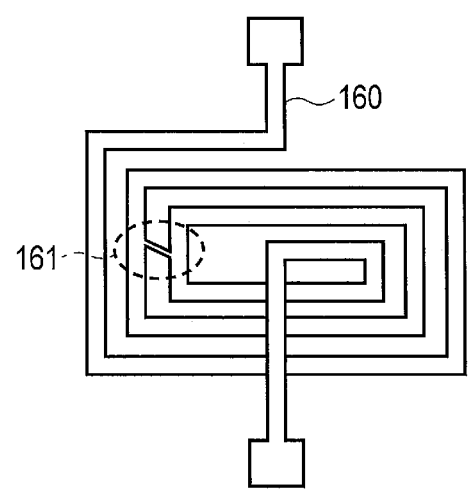
FIG. 12E is a diagram showing a conductive pattern formed into a coil pattern.

FIG. 12E shows a conductive pattern formed into a coil pattern 160. Coil patterns are commonly used for antennae of small mobile devices to transmit and receive radio waves or to supply power. When a shorting portion 161 is produced in such a coil pattern 160, only a bypass will be formed to short-cut the current path. The sensing signal will therefore flow normally between two electrodes, which prevents a shorting defect from being detected.

In contrast, according to the present embodiment, a conductive pattern can be acquired as an image, thus enabling a shorting defect in a coil to be easily detected.

Figure 13:
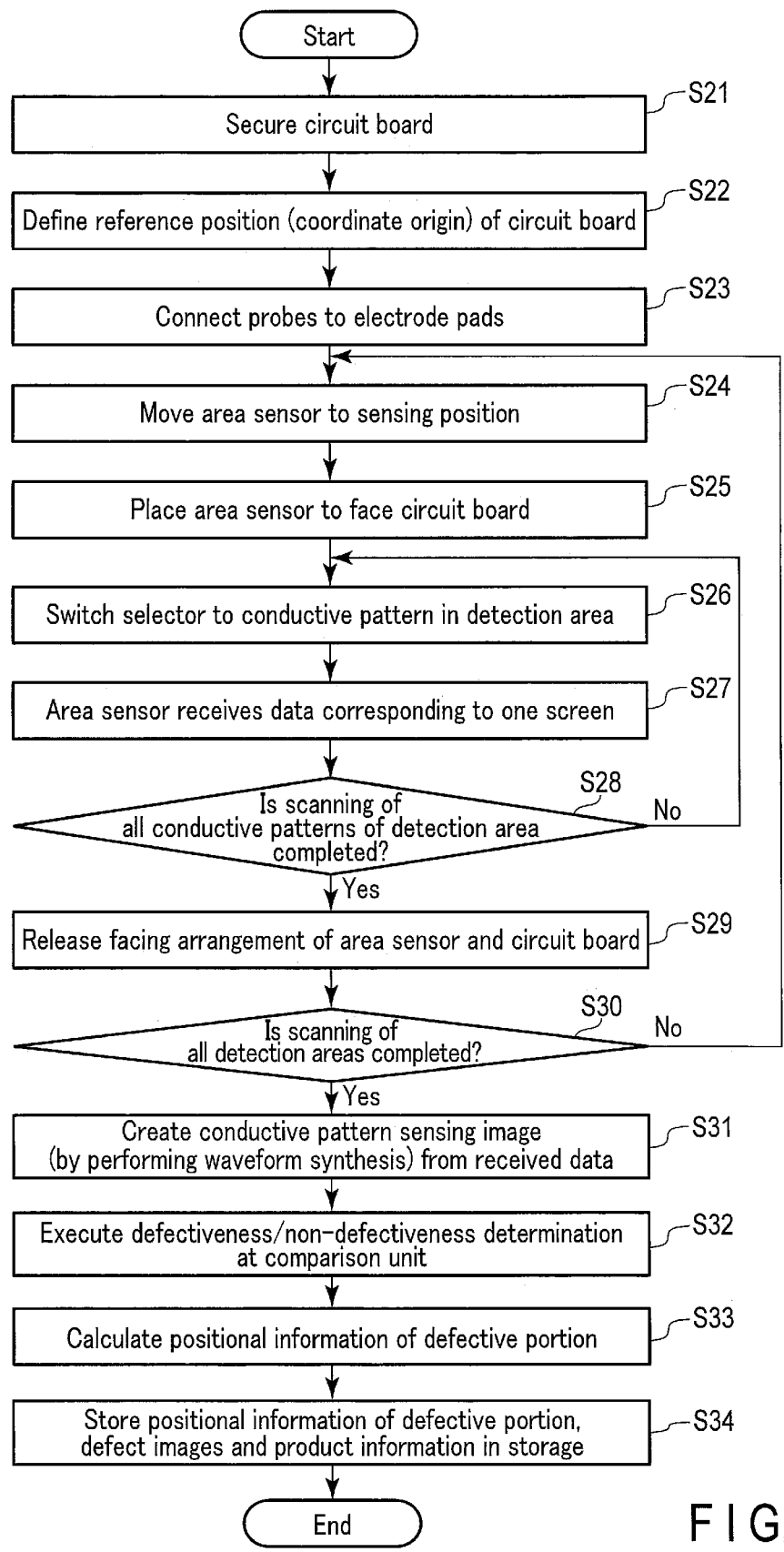
FIG. 13 is a flowchart explaining a detection operation of the conductive pattern sensing apparatus according to the first embodiment.

Next, the detection operation of the conductive pattern sensing apparatus according to the present embodiment will be described by referring to the flowchart of FIG. 13.

The controller 64 places a circuit board at a circuit board mount position on a sensing table of the sensing apparatus, using a circuit board transport mechanism, which is not illustrated (step S21). Next, the controller 64 defines a reference position marker of the circuit board or a predetermined position of the conductive pattern as a reference position and defines the coordinate system by using this reference position as a coordinate origin (x=0, y=0) (step S22). To bring the area sensor 80 close to the conductive pattern, the controller 64 further sets the coordinate origin (z=0) serving as the reference for determining the height of the surface of the sensing table or conductive pattern formation surface of the circuit board in the height direction (Z direction).

As mentioned earlier, the sensing area (effective sensing area) of the area sensor 80 is smaller than the area of the conductive pattern of the circuit board 100. For this reason, the controller 64 divides the conductive pattern of the circuit board 100 to correspond to the sensing areas of the area sensor 80. The controller 64 sets the positional information (coordinate information) of these sensing areas, and the movement path of the area sensor 80.

Then, the controller 64 brings the electrode pads into contact respectively with the tips of the probes 82 to establish an electrical connection between the electrode pads and probes 82 (step S23). The probes 82 have a mechanism that exerts, with a spring or the like, an urging force upon the conductive pattern 101 in order to avoid damage such as scratches and dents due to contact with the tips of the probes 82, and also to lower the contact resistance to lessen variations in detection values.

Thereafter, the sensor moving unit 56 moves the area sensor 80 to a sensing position (by moving in the x and y directions) based on the previously determined sensing order and coordinate information (x and y coordinates) (step S24). The area sensor 80 that arrives at the sensing position lowers the sensor electrode 2 by way of the sensor moving unit 56 to bring close to the sensing target conductive pattern (by moving in the z direction) so that the area sensor 80 can face the conductive patterns of the detection area (step S25). If the circuit board 100 is unlikely to be displaced in the x and y directions, the protective film formed on the surface of the sensor electrode 2 may be brought into contact with the conductive pattern. Even in this case, with the surface of the sensor electrode 2 not in direct contact with the conductive pattern, capacitive coupling is electrically established.

Then, the controller 64 selectively switches the selector 81 so that a sensing signal can be supplied to the sectioned conductive pattern in the sensing target area towards which the sensor electrodes 2 of the area sensor 80 face (step S26). In this operation, the switch 83 is first switched to apply a sensing signal of the first potential to the conductive pattern, and then again switched to apply a sensing signal of the second potential to the conductive pattern. The controller 64 outputs a differential signal (data) based on the aforementioned sensor output signal (step S27). Thereafter, the controller 64 determines whether the area sensor 80 has received data corresponding to one screen (step S28). If, at the determination of step S28, it is determined that there is a conductive pattern 101 for which the data has not yet been acquired from the sensing target area determined by the sensor electrode 2 ("NO"), the process returns to step S26. If this is the case, the controller 64 switches the selector 81 to the conductive pattern 101 to which a sensing signal is not supplied, and supplies a sensing signal. On the other hand, if, at the determination of step S28, it is determined that the sensor electrode 2 of the area sensor 80 has acquired data from all the facing conductive patterns 101 ("YES"), the sensor moving unit 56 lifts and moves the area sensor 80 away from the current sensing target conductive pattern 101, thereby releasing the facing arrangement (step S29).

Next, the controller 64 determines whether or not the acquisition of the sensor output from the conductive patterns of all the sensing target areas sectioned in accordance with the sensing areas of the area sensor has been completed (step S30). If, at the determination of step S30, it is determined that the sensor output from the conductive pattern of all the sensing target areas is not yet completed ("NO"), the process returns to step S24. In this case the sensor moving unit 56 moves the area sensor 80 to the next sensing target area. On the other hand, if, at the determination of step S30, it is determined that data acquisition from all the sensing target areas is completed ("YES"), the image processing circuit 14 puts together the images of the data acquired for the respective sensing target areas to create a conductive pattern sensing image (by performing waveform synthesis) (step S31).

Thereafter, the comparison unit 59 executes a defectiveness/non-defectiveness determination (step S32). In the defectiveness/non-defectiveness determination, the comparison unit 59 compares, through image matching, the created conductive pattern sensing image with a conductive pattern reference image read from the storage 58, to extract a defect representing an abnormal portion such as a break and short-circuiting. In the defectiveness/non-defectiveness determination, the comparison unit 59 calculates the positional information or coordinate information of a portion determined to be defective (step S33). The comparison unit 59 stores this information together with the information relating to the determination result in the storage 58 (step S34). Then, a sensing sequence is terminated. The information relating to this determination result may include the positional information (coordinate information) of defective portions, defect images, and product information of the sensing target circuit board.

As described above, according to the present embodiment, as long as a sensing signal can be supplied, even if the sensing target conductive pattern includes not only linear portions but also diverted portions and bent portions to mount circuit components, or branched portions, the sensing signal can be detected through capacitive coupling.

In this manner, the shape of conductive patterns can be displayed as an image, thus facilitating the ascertainment of the presence/absence of a defective portion and its position. Furthermore, with a conventional sensing method, the presence/absence of a defective portion is first detected through an electrical sensing operation, and thereafter an image of the defective portion is taken for ascertainment, thus entailing two different sensing operations. In contrast, the conductive pattern sensing apparatus according to the present embodiment requires only a single sensing operation to detect the presence/absence of a defective portion and its position from a conductive pattern image, thus reducing the sensing time and operator workload.

Moreover, after the defectiveness/non-defectiveness is determined, not only the presence/absence of a defective portion but also the conductive patterns subjected to the sensing are displayed as an image. Thus, the sensing result can be reported to the operator in such a fashion that the operator can easily observe the defective portion. In addition, the sensing result is acquired as a defect image together with the positional information (coordinate information). By presenting the positional information of the defective portion in a downstream repairing process, the workload and time length required for the repairing operation of the defective portion can be reduced.

As described above, according to the present embodiment, as long as a sensing signal can be supplied and the sensor electrodes face each other, even if the sensing target conductive pattern includes not only linear portions but also multiply branched patterns such as a parallel pattern, a loop pattern, a coil pattern, and a comb pattern, the detection can be realized regardless of the shape of the conductive pattern. The detection of various types of defects which cannot be detected with the conventional technique of electrical sensing, whereby a sensing signal supplied between electrodes is detected by a sensor electrode, can also be realized, including the detection of breakage, shorting, thinned patterns, and chipped patterns.

Second Embodiment

A cell-size sensing apparatus adopting the capacitance detection area sensor will now be explained.

Figure 15A:
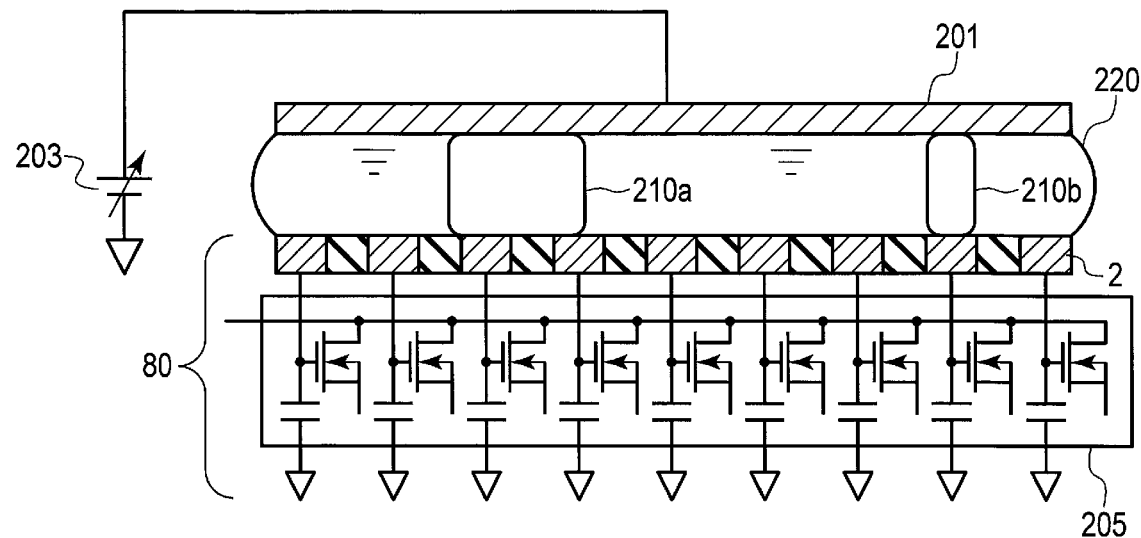
FIG. 15A is a conceptual diagram explaining a cell-size detection operation.
Figure 15B:
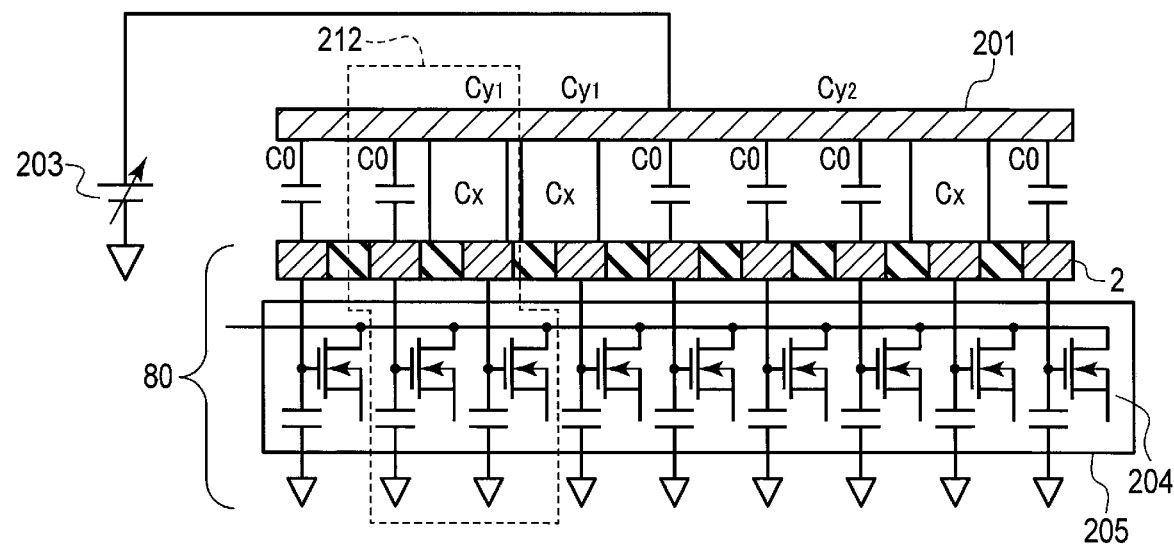
FIG. 15B is a conceptual diagram explaining a cell-size detection operation.

FIG. 14 shows a conceptual structure of a cell-size sensing apparatus 300 incorporating a capacitance detection area sensor. FIGS. 15A and 15B are conceptual diagrams explaining a cell-size detection operation of the cell-size sensing apparatus 300. FIG. 16A is a conceptual diagram showing cells on the area sensor, and FIG. 16B is a conceptual diagram showing a cell image displayed on a display screen by rendering the image of FIG. 16A. For the structural components illustrated in FIG. 14, the components having similar functions or effects to the ones of the first embodiment are given the same reference numerals, and the detailed explanation is omitted.

The cell-size sensing apparatus 300 of FIG. 14 is constituted mainly by a counter electrode unit 210, the area sensor 80, a control apparatus 91, and an image processing circuit 14.

The counter electrode unit 210 includes a counter electrode 201, a counter electrode switch 202, and a variable voltage source 203. The counter electrode 201 and the area sensor 80 face each other with a filling substance, such as an electrolyte 220, interposed. The counter electrode switch 202 performs an ON/OFF operation in accordance with a counter electrode power supply control signal S1 from the control apparatus 91. The variable voltage source 203 controls the voltage of a sensing signal to be supplied to the counter electrode 201 in accordance with a counter electrode voltage control signal S2 from the control apparatus 91.

The control apparatus 91 includes a differential signal generating circuit 13 (differential calculator 30 and AD converter 31) and a timing control circuit 65. The timing control circuit 65 controls the timings of output acquisition from the area sensor 80 at the differential signal generating circuit 13.

FIG. 14 explains a typical example of the processing upon sensor output signals output from two capacitance sensor elements. The sensor output signals are signals output from the individual capacitance sensor elements, and are therefore not limited to the two signals.

A differential signal is output to the image processing circuit 14. The image processing circuit 14 generates an image signal corresponding to the level of the differential signal. The image signal displays, on the aforementioned display 61 of FIG. 10, cell images 211a and 211b as illustrated in FIG. 16B, which will be described later. For the detection of a cell-size, the detection should be conducted with cells immersed in an electrolyte or the like. The container containing the area sensor 80 therefore has a bottom on which the area sensor 80 is placed, and walls provided around the bottom in a watertight manner, such as a tray. To avoid degradation of the sensor electrodes 2 of the area sensor 80 due to corrosion of the electrolyte, a nitride film or oxide film of a known capacitance may be formed on the sensor electrode 2 in a manner which protects it from the electrolyte.

The counter electrode of the capacitance sensor element 1 according to the present embodiment is not an essential component. For instance, the capacitance sensor element 1 may not be provided with a counter electrode to which a voltage is applied. In a state in which only the sensor electrode 2 is exposed in an electrolyte, in air, in any gaseous atmosphere, or in a vacuum, a change in the capacitance caused by a substance propagating in such a state and attached to the sensor electrode 2 or a change of a voltage caused by electrical charges and ions can also be detected. For instance, the capacitance sensor element 1 may create an image from the change in the capacitance that is observed when the cells in the electrolyte are attached to the sensor electrode.

Next, the detection of the size of cells will be explained by referring to FIGS. 15A and 15B.

FIG. 15A conceptually shows the structure of the counter electrode 201 and sensor electrode 2. The sensor electrode 2 is provided with switch elements (transistors) 204 and a reading circuit 205 including capacitors.

In FIG. 15A, cells 210a and 210b immersed in the electrolyte 220 are placed on the sensor electrode 2 of the area sensor 80. Then, the counter electrode 201 is placed in parallel to the area sensor 80 in a manner such that air bubbles or the like will not enter the electrolyte 220. Then, the aforementioned sensing signal is supplied from the variable voltage source 203. Here, as illustrated in FIG. 15B, C0 represents the capacitance of the electrolyte 220 between the counter electrode 201 and the sensor electrode 2. When a cell 210a is present between the counter electrode 201 and the sensor electrode 2, the cell 210a has a capacitance Cx.

Thus, when the cell 210a is present, the capacitance between the counter electrode 201 and the sensor electrode 2 is Cx1. In general, the permittivity of the cell 210a is higher than the permittivity of the filling substance, and therefore capacitance C0<capacitance Cx. With the cells 210a and 210b present, more charge can be stored, which also increases the acquired detection signal value.

As illustrated in FIG. 16A, the greater the size of the cells 210a and 210b, the greater the number of sensor electrodes in the area sensor 80 brought into contact with the cells. In other words, the area sensor 80 in contact with the cells can detect the size and shape of cells. By executing image signal processing upon these sensor output signals, the cell images 211a and 211b that match the sizes of the cells 210a and 210b can be displayed on the display screen 95, as illustrated in FIG. 16B.

In view of the above, the cell-size sensing apparatus 300 according to the present embodiment can acquire sensor detection signals that correspond to the sizes or shapes of the cells placed on, or brought into contact with, the capacitance detection area sensor. Thus, the same cell or different cells can be easily compared with respect to their sizes and shapes.

Furthermore, if the sizes and shapes of the cells change with time, the capacitance detections can be continuously conducted at predetermined time intervals so that the time change of the cells can be easily observed. According to the present embodiment, the area sensor can detect the change in the capacitance between the counter electrode 201 and sensor electrode 2 and create an image for the change in a short time period. Thus, even if the cells 210a and 210b continue moving in the electrolyte without staying on the area sensor, the capacitance detection can be conducted to detect the sizes and shapes of these cells.

Third Embodiment

An antigen capturing and detecting apparatus incorporating a capacitance detection area sensor will be explained.

FIG. 17 conceptually explains an antigen capturing operation of an antigen capturing and detecting apparatus 400. For the structural components illustrated in FIG. 17, the components having similar functions or effects to the ones of the second embodiment are given the same reference numerals, and the detailed explanation is omitted.

The antigen capturing and detecting apparatus 400 according to the present embodiment incorporates the aforementioned capacitance detection area sensor and detects the capture of antigens 235 by aptamers (e.g., nucleic-acid aptamers) 234 in real time. In this embodiment, the capture of antigens 235 by aptamers 234 will be explained. The embodiment, however, is also applicable to antibodies binding with antigens 235.

The antigen capturing and detecting apparatus 400 has a structure similar to that of the aforementioned cell-size sensing apparatus 300 according to the second embodiment, except that the antigen capturing and detecting apparatus 400 includes, as a differing part of the structure, a fixation layer 232, a cross-linking agent 233, and aptamers 234 deposited on the sensor electrode 2. A nitride film or oxide film of a known capacitance may be formed between the sensor electrode 2 and fixation layer 232 to be used as a protective film.

According to the present embodiment, a change in the capacitance is detected when the aptamers 234 capture the antigens 235 and bind specifically with them, and this capacitance change is displayed as an image. In the antigen capturing and detecting apparatus 400 of FIG. 17, the space between the sensor electrodes 2 of the area sensor 80 and the counter electrode 201 is filled with an electrolyte 220 or the like in a manner such that air bubbles or the like will not enter. The electrolyte has a capacitance C0, as mentioned earlier. It is assumed that the antigens 235 floating in the electrolyte 220 have a capacitance Cx. In the same manner as in the second embodiment, if no antigen 235 is present between the sensor electrode 2 and counter electrode 201, a sensing signal corresponding to the capacitance C0 of the electrolyte is detected. On the other hand, if antigens 235 are present between the sensor electrode 2 and counter electrode 201, a sensing signal corresponding to the capacitance Cx of the antigens 235 is detected.

According to the present embodiment, the antigens 235 not captured by the aptamers 234 are floating in the electrolyte, and an image of a different composition is therefore obtained at each time of the capacitance detection. When the antigens 235 are captured by the aptamers 234, the capacitance Cx of the antigens 235 will be fixed. As a result, a fixed pattern appears in sequential images generated from the sequential capacitance detections. In general, as the time passes from the initial detection, the area of the fixed pattern increases. The sensing signal may be supplied upon each of the capacitance detection.

In a generated image, the capacitance between the counter electrode 201 and sensor electrode 2 represents Cx if an antigen 235 is present in between. In general, capacitance C0<capacitance Cx, which means that a greater amount of charge can be stored when an antigen 235 is present. This also increases the acquired detection signal value. By binarizing the sensor output signals as a determination result in the process for image signal conversion, the antigens 235 being captured by the aptamers 234 can be imaged and displayed on the display screen.

As described above, according to the present embodiment, antigens are captured by the aptamers 234 as time passes, developing unevenness in charges in the electrolyte. The course of this capacitance change is processed into images so that the binding rate and distribution can be visually recognized.

The present invention is not limited to the above embodiments, and can be modified in various manners without departing from the scope of the invention. In addition, various inventions may be achieved by selecting or combining the disclosed structural components to solve the aforementioned technical issue.

The invention claimed is:

1. A capacitance detection area sensor, comprising:
a capacitance detection area sensor circuit including a plurality of capacitance sensor elements arranged in a two-dimensional array, each of the capacitance sensor elements including a sensor electrode configured to, when capacitively coupled with a detection target having an electrical charge, detect an electrical charge in accordance with a change in a capacitance, a storage element configured to store an electrical charge of the sensor electrode, and a reset element configured to reset the storage element;
a sensor element selection circuit configured to select a capacitance sensor element to be capacitively coupled sequentially from the capacitance detection area sensor circuit in order of rows or columns;
a reading circuit configured to acquire a first signal at a first potential and a second signal at a second potential different from the first potential, from the selected capacitance sensor;
a first signal storage circuit arranged for each column to store the read-out first signal;
a second signal storage circuit arrange for each column to store the read-out second signal;
a differential signal generating circuit configured to calculate a difference between the stored first signal and the stored second signal to generate a differential signal;
an image processing circuit configured to generate an image representing a shape of the detection target based on a level of the differential signal from the differential signal generating circuit; and
a controller configured to open the reset element of the capacitance detection area sensor circuit after bringing the reset element into conduction for each one of the rows selected from among the two-dimensional array to reset the storage element to set a potential of the sensor electrode to a reference value; acquire the first signal to store the first signal in the first signal storage circuit; after a predetermined period of time, acquire the second signal to store the second signal in the second signal storage circuit; and, after a predetermined period of time, calculate a differential signal of the first signal read from the first signal storage circuit and the second signal read from the second signal storage circuit.

2. The capacitance detection area sensor according to claim 1, further comprising:
a shield electrode arranged at a distance apart from the sensor electrode to insulate the sensor electrode from a surrounding,
wherein the first potential or the second potential is applied to the shield electrode.

3. A conductive pattern sensing apparatus, comprising:
a sensing signal supplying circuit configured to supply, to a detection target conductive pattern formed on a substrate, a sensing signal having a potential difference between a first potential and a second potential;
a capacitance detection area sensor including a sensor electrode configured to, when capacitively coupled to the conductive pattern, detect an electrical charge in accordance with a change in a capacitance, the capacitance detection area sensor further including capacitance sensor elements arranged in a two-dimensional array, the capacitance sensor elements configured to acquire from the sensor electrode a first sensor output signal and a second sensor output signal at a timing of the sensing signal supplied to the conductive pattern at the first potential and at the second potential, respectively;
a sensor moving mechanism configured to support the capacitance detection area sensor, move the sensor electrode of the capacitance detection area sensor to a sensing target area of the conductive pattern, and bring the sensor electrode close to the conductive pattern;
a controller including a differential signal generating circuit configured to calculate a difference of sensor output signals acquired from the capacitance detection area sensor to generate a differential signal;
an image processing circuit configured to allocate an image of a color or a tone that differs in accordance with a value of the differential signal output from the controller to generate a conductive pattern sensing image that describes a shape of the conductive pattern; and
a comparison circuit configured to compare a preset conductive pattern reference image serving as a comparison reference of the conductive pattern with the conductive pattern sensing image generated by the image processing circuit to determine a defective portion based on a difference.

4. The conductive pattern sensing apparatus according to claim 3, wherein
   a protective film of an insulative thin film is formed on the sensor electrode.

5. A capacitance detection area sensor apparatus comprising the capacitance detection area sensor according to claim 1, wherein
   the capacitance sensor element detects an electrical charge of a charge amount in accordance with the change of the capacitance between an external electrode and the capacitance sensor element, where an electrolyte is contained in a sealed manner between the external electrode and the capacitance sensor element, and at least one target object having a specific capacitance is contained in the electrolyte, and
   the image processing circuit generates an image describing a size and shape of the target object based on a change in the charge amount.

6. A capacitance detection area sensor apparatus comprising the capacitance detection area sensor according to claim 1, wherein
   a fixation layer, a cross-linking agent and an aptamer are deposited on the sensor electrode of the capacitance sensor element, an electrolyte is contained in a sealed manner between an external electrode and the sensor electrode, and at least one antigen having a specific capacitance is contained in the electrolyte, and
   an electrical charge of a charge amount corresponding to a change in a capacitance between the external electrode and the capacitance sensor element in accordance with the aptamer capturing the antigen is detected, and the image processing circuit generates a series of images that describe a course of the antigen being captured by the aptamer based on the change of the charge amount.

* * * * *